(12) United States Patent
Hagiwara et al.

(10) Patent No.: US 11,961,631 B2
(45) Date of Patent: Apr. 16, 2024

(54) CONNECTION STRUCTURE OF SUPERCONDUCTING LAYER, SUPERCONDUCTING WIRE, SUPERCONDUCTING COIL, SUPERCONDUCTING DEVCE, AND CONNECTION METHOD OF SUPERCONDUCTING LAYER

(71) Applicant: KABUSHIKI KAISHA TOSHIBA, Tokyo (JP)

(72) Inventors: Masaya Hagiwara, Yokohama Kanagawa (JP); Tomoko Eguchi, Yokohama Kanagawa (JP); Keiko Albessard, Yokohama Kanagawa (JP); Yasushi Hattori, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 17/689,455

(22) Filed: Mar. 8, 2022

(65) Prior Publication Data
US 2023/0085118 A1    Mar. 16, 2023

(30) Foreign Application Priority Data
Sep. 14, 2021    (JP) .................................. 2021-149038

(51) Int. Cl.
*H01B 12/06* (2006.01)
*H01F 6/06* (2006.01)

(52) U.S. Cl.
CPC ............... *H01B 12/06* (2013.01); *H01F 6/06* (2013.01)

(58) Field of Classification Search
CPC .................................. H01B 12/06; H01F 6/06
See application file for complete search history.

(56) References Cited

U.S. PATENT DOCUMENTS

2018/0025812 A1    1/2018  Ohki et al.
2022/0199887 A1    6/2022  Hagiwara et al.

FOREIGN PATENT DOCUMENTS

| JP | 6178779 B2 | 8/2017 |
|---|---|---|
| JP | 6675590 B2 | 4/2020 |
| JP | 2022-41667 A | 3/2022 |
| WO | WO 2022/049800 A1 | 3/2022 |

*Primary Examiner* — Jeremy C Norris
(74) *Attorney, Agent, or Firm* — Finnegan, Henderson, Farabow, Garrett & Dunner, LLP

(57) ABSTRACT

A connection structure of a superconducting layer according to an embodiment includes a first superconducting layer, a second superconducting layer, and a connection layer provided between the first superconducting layer and the second superconducting layer and including a first substance containing a rare earth element, barium, copper, and oxygen and a second substance containing a metal element, in which a first region per unit area at a first interface between the first superconducting layer and the connection layer is 1% or more and 50% or less where the second substance and the first superconducting layer are in contact with each other, and a second region per unit area at a second interface between the second superconducting layer and the connection layer is 1% or more and 50% or less where the second substance and the second superconducting layer are in contact with each other.

20 Claims, 20 Drawing Sheets

CONNECTION STRUCTURE OF SUPERCONDUCTING LAYER, SUPERCONDUCTING WIRE, SUPERCONDUCTING COIL, SUPERCONDUCTING DEVCE, AND CONNECTION METHOD OF SUPERCONDUCTING LAYER

CROSS-REFERENCE TO RELATED APPLICATION

This application is based upon and claims the benefit of priority from Japanese Patent Application No. 2021-149038, filed on Sep. 14, 2021, the entire contents of which are incorporated herein by reference.

FIELD

Embodiments described herein relate generally to a connection structure of a superconducting layer, a superconducting wire, a superconducting coil, a superconducting device, and a connection method of a superconducting layer.

BACKGROUND

For example, in a nuclear magnetic resonance apparatus (NMR) or a magnetic resonance imaging apparatus (MRI), a superconducting coil is used to generate a strong magnetic field. The superconducting coil is formed by winding a superconducting wire around a winding frame.

In order to lengthen the superconducting wire, for example, a plurality of superconducting wires are connected. For example, end portions of two superconducting wires are connected using a connection structure. The connection structure of connecting superconducting wires is required to have low electric resistance and high mechanical strength.

DETAILED DESCRIPTION

Figure 1:
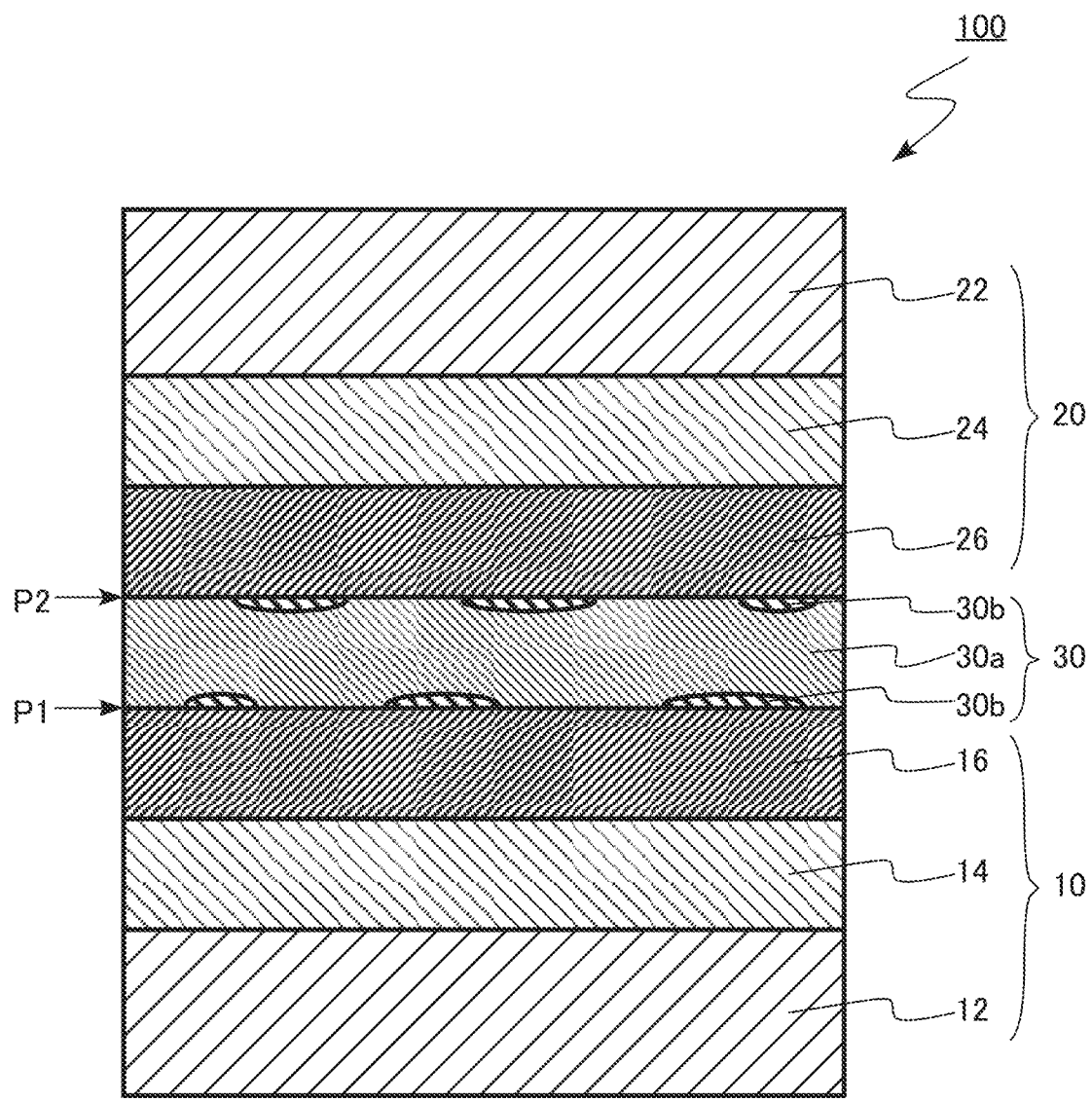
FIG. 1 is a schematic cross-sectional view of a connection structure of a superconducting layer according to a first embodiment.

A connection structure of a superconducting layer according to an embodiment includes a first superconducting layer; a second superconducting layer; and a connection layer provided between the first superconducting layer and the second superconducting layer, and the connection layer including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn). A first area ratio at a first interface between the first superconducting layer and the connection layer is 1% or more and 50% or less, the first area ratio is an area ratio of a first region per unit area, the first region is a region where the second substance and the first superconducting layer are in contact with each other, and a second area ratio at a second interface between the second superconducting layer and the connection layer is 1% or more and 50% or less, the second area ratio is an area ratio of a second region per unit area, the second region is a region where the second substance and the second superconducting layer are in contact with each other.

Hereinafter, embodiments of the present disclosure will be described with reference to the drawings. In the following description, the same or similar members and the like are denoted by the same reference numerals, and the description of the members and the like once described may be appropriately omitted.

In the present specification, a "particle size" of a particle or the like refers to a major diameter of the particle unless otherwise specified. The major diameter of the particle is a maximum length among lengths between any two points on an outer periphery of the particle. In addition, a minor diameter of the particle is a length between two points where a line passing through a midpoint of two points as the basis of the major diameter of the particle and perpendicular to a major diameter direction of the particle intersects the outer periphery of the particle. An aspect ratio of the particles is a ratio of the major diameter to the minor diameter (major diameter/minor diameter). The major diameter and minor diameter of the particle can be obtained, for example, by image analysis of a scanning electron microscope image (SEM image). The definition of the "particle size" is an example, and the definition of the "particle size" is not limited thereto.

In the present specification, detection of an element contained in a particle or the like and measurement of an atomic concentration of the element can be performed using, for example, energy dispersive X-ray spectroscopy (EDX) or wavelength dispersive X-ray spectroscopy (WDX). In addition, the substance contained in the particles or the like can be identified using, for example, a powder X-ray diffraction method.

First Embodiment

A connection structure of a superconducting layer according to a first embodiment includes a first superconducting layer; a second superconducting layer; and a connection layer provided between the first superconducting layer and the second superconducting layer, and the connection layer including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn). A first area ratio at a first interface between the first superconducting layer and the connection layer is 1% or more and 50% or less, the first area ratio is an area ratio of a first region per unit area, the first region is a region where the second substance and the first superconducting layer are in contact with each other. A second area ratio at a second interface between the second superconducting layer and the connection layer is 1% or more and 50% or less, the second area ratio is an area ratio of a second region per unit area, the second region is a region where the second substance and the second superconducting layer are in contact with each other FIG. 1 is a schematic cross-sectional view of a connection structure of a superconducting layer according to a first embodiment. A connection structure 100 of the first embodiment is a structure which physically and electrically connects two superconducting layers to each other. The connection structure 100 is used, for example, for connecting two superconducting wires and lengthening the superconducting wires.

The connection structure 100 includes a first superconducting member 10, a second superconducting member 20, and a connection layer 30. The connection structure 100 is a structure in which the first superconducting member 10 and the second superconducting member 20 are connected by the connection layer 30. The connection layer 30 is provided between the first superconducting member 10 and the second superconducting member 20.

The first superconducting member 10 includes a first substrate 12, a first intermediate layer 14, and a first superconducting layer 16. The second superconducting member 20 includes a second substrate 22, a second intermediate layer 24, and a second superconducting layer 26.

The first substrate 12 is, for example, metal. The first substrate 12 is, for example, a nickel alloy or a copper alloy. The first substrate 12 is, for example, a nickel-tungsten alloy.

The first superconducting layer 16 is, for example, an oxide superconducting layer. The first superconducting layer 16 contains, for example, a rare earth element (RE), barium (Ba), copper (Cu), and oxygen (O). The first superconducting layer 16 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first superconducting layer 16 has, for example, a chemical composition represented by $(RE)Ba_2Cu_3O_\delta$ (RE is a rare earth element, $6 \leq \delta \leq 7$). The first superconducting layer 16 has, for example, a chemical composition represented by $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$). The first superconducting layer 16 is, for example, a rare earth oxide superconductor.

The first superconducting layer 16 includes, for example, a single crystal having a perovskite structure.

The first superconducting layer 16 is formed on the first intermediate layer 14 using, for example, a metal organic deposition method (MOD method), a pulsed laser deposition method (PLD method), or a metal organic chemical vapor deposition method (MOCVD method).

The first intermediate layer 14 is provided between the first substrate 12 and the first superconducting layer 16. The first intermediate layer 14 is in contact with, for example, the first superconducting layer 16. The first intermediate layer 14 has a function of improving a crystal orientation of the first superconducting layer 16 formed on the first intermediate layer 14.

The first intermediate layer 14 contains, for example, a rare earth oxide. The first intermediate layer 14 has, for example, a stacked structure of a plurality of films. The first intermediate layer 14 has, for example, a structure in which yttrium oxide ($Y_2O_3$), yttria stabilized zirconia (YSZ), and cerium oxide ($CeO_2$) are laminated from the first substrate 12 side.

The second substrate 22 is, for example, metal. The second substrate 22 is, for example, a nickel alloy or a copper alloy. The second substrate 22 is, for example, a nickel-tungsten alloy.

The second superconducting layer 26 is, for example, an oxide superconducting layer. The second superconducting layer 26 contains, for example, a rare earth element (RE), barium (Ba), copper (Cu), and oxygen (O). The first superconducting layer 16 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The second superconducting layer 26 has, for example, a chemical composition represented by $(RE)Ba_2Cu_3O_\delta$ (RE is a rare earth element, $6 \leq \delta \leq 7$). The second superconducting layer 26 has, for example, a chemical composition represented by $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$). The second superconducting layer 26 is, for example, a rare earth oxide superconductor.

The second superconducting layer 26 includes, for example, a single crystal having a perovskite structure.

The second superconducting layer 26 is formed on the second intermediate layer 24 by using, for example, the MOD method, the PLD method, or the MOCVD method.

The second intermediate layer 24 is provided between the second substrate 22 and the second superconducting layer 26. The second intermediate layer 24 is in contact with, for example, the second superconducting layer 26. The second intermediate layer 24 has a function of improving a crystal orientation of the second superconducting layer 26 formed on the second intermediate layer 24.

The second intermediate layer 24 contains, for example, a rare earth oxide. The second intermediate layer 24 has, for example, a stacked structure of a plurality of films. The second intermediate layer 24 has, for example, a structure in which yttrium oxide ($Y_2O_3$), yttria stabilized zirconia (YSZ), and cerium oxide ($CeO_2$) are laminated from the second substrate 22 side.

The connection layer 30 is provided between the first superconducting layer 16 and the second superconducting layer 26. The connection layer 30 is in contact with the first superconducting layer 16. The connection layer 30 is in contact with the second superconducting layer 26.

An interface between the first superconducting layer 16 and the connection layer 30 is a first interface (P1 in FIG. 1). An interface between the second superconducting layer 26 and the connection layer 30 is a second interface (P2 in FIG. 1).

The first superconducting layer 16 and the second superconducting layer 26 are physically and electrically connected by using the connection layer 30.

The connection layer 30 includes a first substance 30a and a second substance 30b.

The first substance 30a is in contact with the first superconducting layer 16. The first substance 30a is in contact with the second superconducting layer 26.

The first substance 30a is an oxide superconductor. The first substance 30a contains a rare earth element (RE), barium (Ba), copper (Cu), and oxygen (O). The first substance 30a includes, for example, at least one rare earth element (RE) from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first substance 30a has, for example, a chemical composition represented by $(RE)Ba_2Cu_3O_\delta$ (RE is a rare earth element, $6 \leq \delta \leq 7$). The first substance 30a has, for example, a chemical composition represented by $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$).

The first substance 30a includes, for example, a crystal having a perovskite structure.

The first substance 30a has, for example, a plate shape.

The second substance 30b is in contact with the first superconducting layer 16. The second substance 30b is in contact with the second superconducting layer 26.

The second substance 30b is a conductor. The second substance 30b is, for example, a metal.

The second substance 30b contains at least one metal element selected from the group consisting of silver (Ag), aluminum (Al), indium (In), copper (Cu), tin (Sn), and zinc (Zn). The second substance 30b is, for example, silver (Ag).

The second substance 30b contains, for example, oxygen (O). An atomic concentration of oxygen (O) contained in the second substance 30b is, for example, 0.01% or more and 35% or less.

In the first interface P1 between the first superconducting layer 16 and the connection layer 30, an area ratio per unit area of a first region where the second substance 30b and the first superconducting layer 16 are in contact with each other is 1% or more and 50% or less. The area ratio per unit area of a first region where the second substance 30b and the first superconducting layer 16 are in contact with each other is an example of the first area ratio. In addition, in the second interface P2 between the second superconducting layer 26 and the connection layer 30, an area ratio per unit area of a second region where the second substance 30b and the second superconducting layer 26 are in contact with each other is 1% or more and 50% or less. The area ratio per unit area of a second region where the second substance 30b and the second superconducting layer 26 are in contact with each other is an example of the second area ratio. The unit area is, for example, 1 $mm^2$.

The area ratio of the first region is obtained, for example, by acquiring a ratio of a length of contact between the second substance 30b and the first superconducting layer 16 to a length of the first interface P1 in a cross section of the plurality of connection layers 30 parallel to a direction from the first superconducting layer 16 toward the second superconducting layer 26, and calculating an average value of the acquired ratios of the plurality of lengths. In addition, the area ratio of the second region is obtained, for example, by acquiring a ratio of a length of contact between the second substance 30b and the second superconducting layer 26 to a length of the second interface P2 in the cross section of the plurality of connection layers 30 parallel to the direction from the first superconducting layer 16 toward the second superconducting layer 26, and calculating an average value of the acquired ratios of the plurality of lengths.

The second substance 30b includes, for example, a plurality of particles as illustrated in FIG. 1. A median value of major diameters of the plurality of particles is, for example, 100 nm or more and 10 μm or less.

For example, among the plurality of particles, a particle in contact with the first interface P1 has an aspect ratio of 5 or more and 100 or less. Among the plurality of particles, a particle in contact with the second interface P2 has an aspect ratio of 5 or more and 100 or less.

For example, as illustrated in FIG. 1, the major diameter direction of the particles is aligned in a direction parallel to the first interface P1 or the second interface P2. In particular, among the plurality of particles, the major diameter of the particle in contact with the first superconducting layer 16 or the second superconducting layer 26 is aligned in a direction parallel to the first interface P1 or the second interface P2.

The major diameter direction of the particle is, for example, in the range of 0 degrees or more and 30 degrees or less with respect to the first interface P1. In addition, the major diameter direction of the particle is, for example, in the range of 0 degrees or more and 30 degrees or less with respect to the second interface P2.

Next, an example of a connection method of a superconducting layer according to the first embodiment will be described. The connection method of the superconducting layer according the first embodiment is a method for forming the connection structure 100. FIGS. 2, 3, 4, 5, 6, and 7 are views illustrating the connection method of a superconducting layer according to the first embodiment.

In the connection method of a superconducting layer according to the first embodiment, a first superconducting layer and a second superconducting layer are prepared, a substance containing a rare earth element (RE), barium (Ba), copper (Cu), and oxygen (O) and silver oxide are sandwiched between the first superconducting layer and the second superconducting layer, and heat treatment is performed in a state where the first superconducting layer and the second superconducting layer are pressurized.

Figure 2:
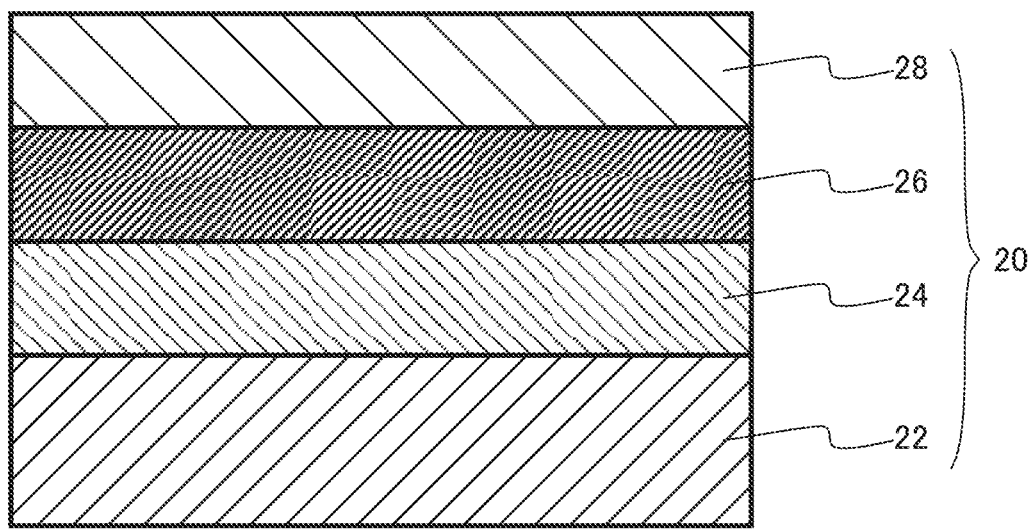
FIG. 2 is a diagram illustrating preparation of a first superconducting layer and a second superconducting layer in a connection method of a superconducting layer according to the first embodiment.
Figure 2:
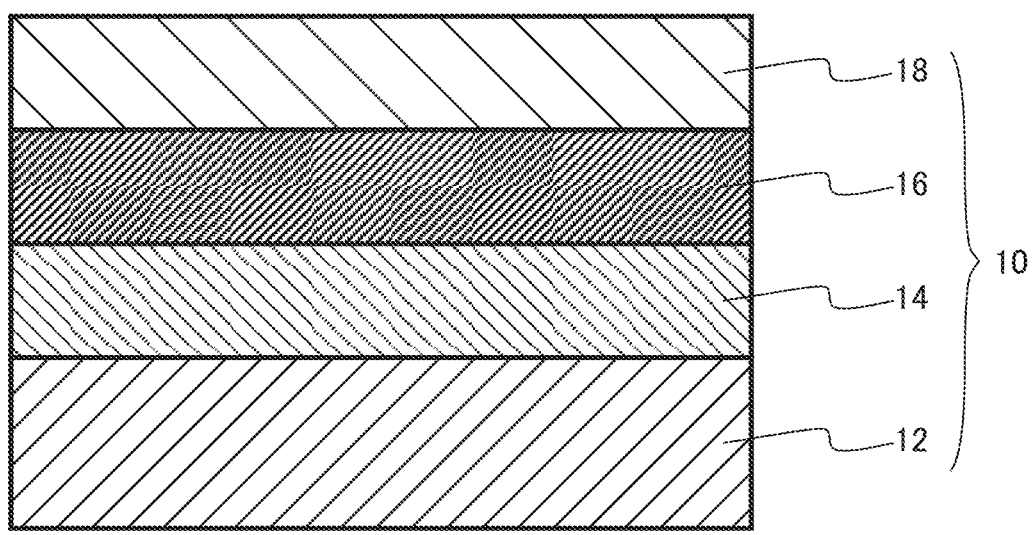

First, the first superconducting layer 16 and the second superconducting layer 26 are prepared. The first superconducting member 10 and the second superconducting member 20 are prepared (FIG. 2).

The first superconducting member 10 includes the first substrate 12, the first intermediate layer 14, the first superconducting layer 16, and a first protective layer 18. The first protective layer 18 is provided on the first superconducting layer 16. The first protective layer 18 has a function of protecting the first superconducting layer 16.

The first protective layer 18 is, for example, a metal, and the first protective layer 18 contains, for example, silver (Ag) or copper (Cu).

The second superconducting member 20 includes the second substrate 22, the second intermediate layer 24, the second superconducting layer 26, and a second protective layer 28. The second protective layer 28 is provided on the second superconducting layer 26. The second protective layer 28 has a function of protecting the second superconducting layer 26.

The second protective layer 28 is, for example, a metal, and the second protective layer 28 contains, for example, silver (Ag) or copper (Cu).

Figure 3:
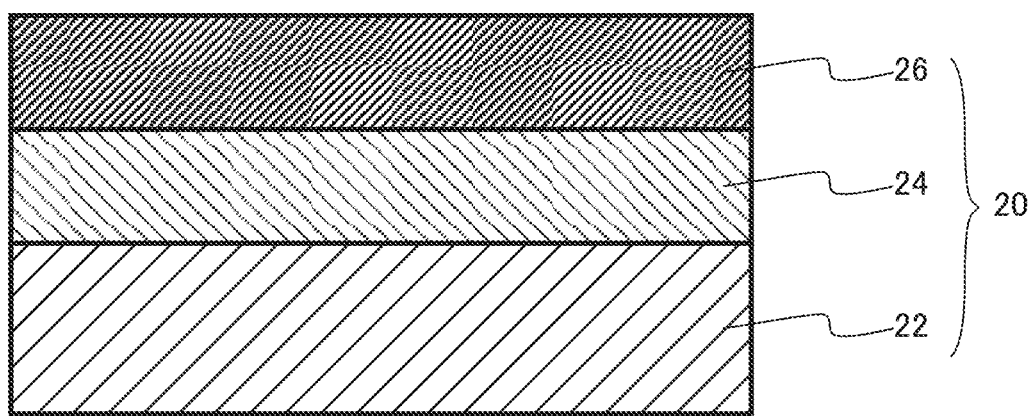
FIG. 3 is a view illustrating removal of a first protective layer and a second protective layer in the connection method of a superconducting layer according to the first embodiment.
Figure 3:
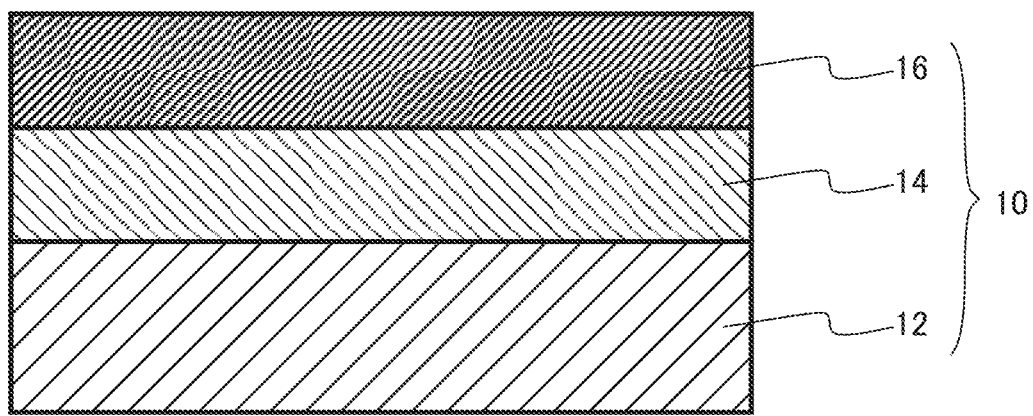

Next, the first protective layer 18 on the first superconducting layer 16 is removed. Next, the second protective layer 28 on the second superconducting layer 26 is removed (FIG. 3). The first protective layer 18 and the second protective layer 28 are removed using, for example, a wet etching method.

Next, a slurry 29 is prepared. The slurry 29 includes silver oxide particles 29a.

Figure 4:
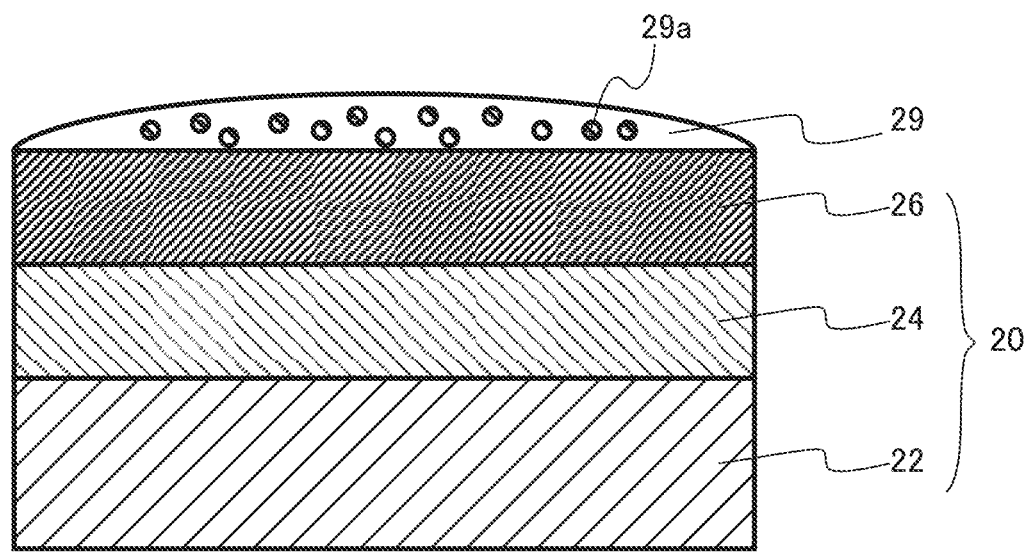
FIG. 4 is a view illustrating application of a slurry onto the first superconducting layer and the second superconducting layer in the connection method of a superconducting layer according to the first embodiment.
Figure 4:
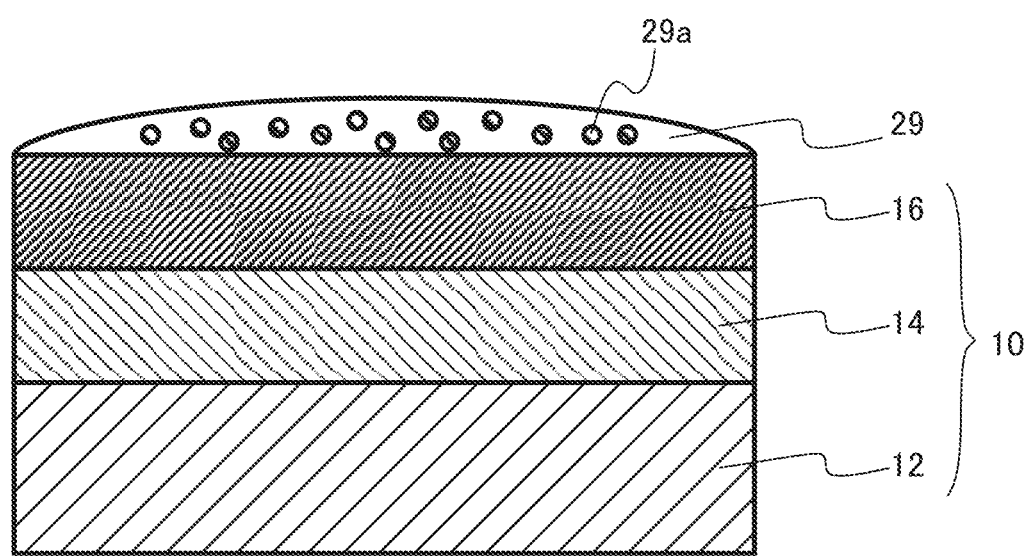

Next, the slurry 29 is applied onto the first superconducting layer 16 and the second superconducting layer 26 (FIG. 4).

Next, the first substance 30a is prepared. The first substance 30a has a plate shape.

The first substance 30a contains a rare earth element (RE), barium (Ba), copper (Cu), and oxygen (O). The first substance 30a is a rare earth oxide. The first substance 30a is, for example, a sintered body of $GdBa_2Cu_3O_\delta$ ($6 \leq \delta \leq 7$).

The first substance 30a is, for example, a composite of a rare earth oxide superconductor prepared by an MOD method and a sintered body of a rare earth oxide superconductor fired from an oxide raw material. For example, a composite can be produced by applying an MOD solution to a sintered body of $GdBa_2Cu_3O_\delta$ ($6 \leq \delta \leq 7$) and performing a heat treatment. The temperature of the heat treatment is, for example, 700° C. or more and 850° C. or less. The heat treatment is performed, for example, at atmospheric pressure. The heat treatment is performed, for example, in an air atmosphere, an Ar atmosphere, a nitrogen atmosphere, an oxygen atmosphere, a mixed atmosphere of Ar and oxygen, or a mixed atmosphere of nitrogen and oxygen. By using the composite, electrical connectivity between the connection layer 30 and the first superconducting layer 16 and the second superconducting layer 26 is improved, and an electrical resistance can be reduced.

Figure 5:
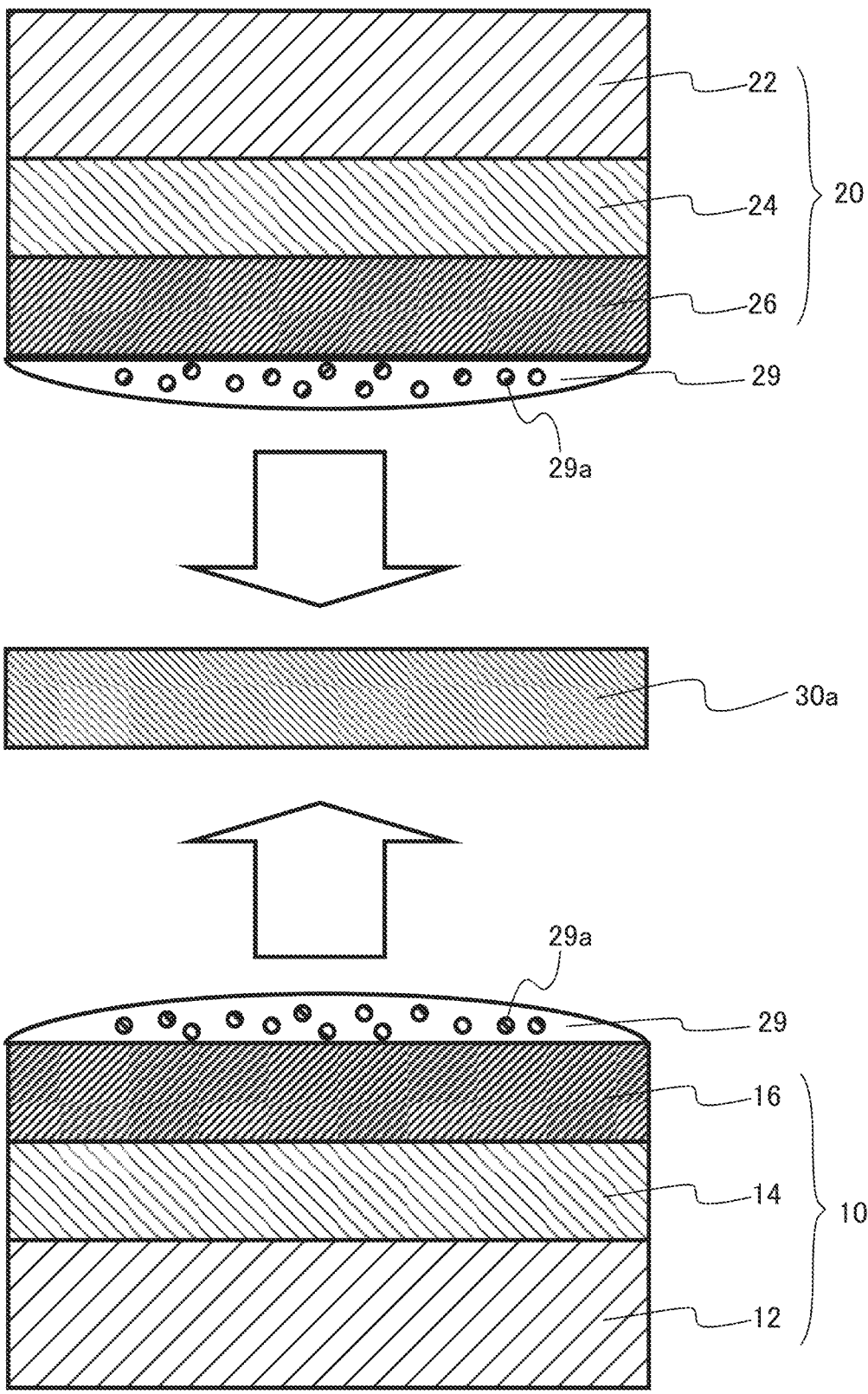
FIG. 5 is a view illustrating a state in which the first superconducting layer and the second superconducting layer face each other in the connection method of a superconducting layer according to the first embodiment.
Figure 6:
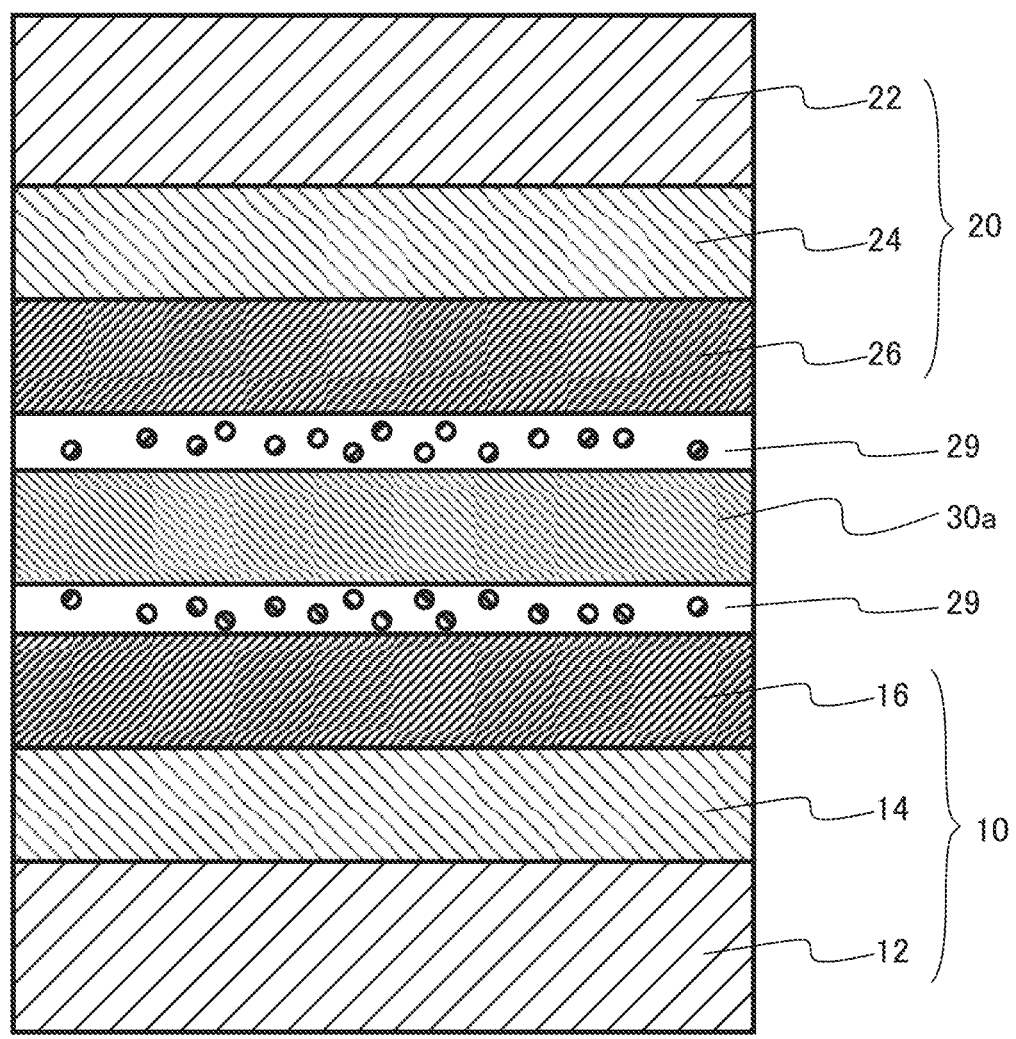
FIG. 6 is a view illustrating a state in which the first superconducting layer and the second superconducting layer are superposed in the connection method of a superconducting layer according to the first embodiment.

Next, for example, the second superconducting layer 26 is inverted, and the first superconducting layer 16 and the second superconducting layer 26 face each other with the first substance 30a and the slurry 29 interposed therebetween (FIG. 5). Then, the first superconducting layer 16 and the second superconducting layer 26 are superposed with the first substance 30a interposed therebetween (FIG. 6).

Figure 7:
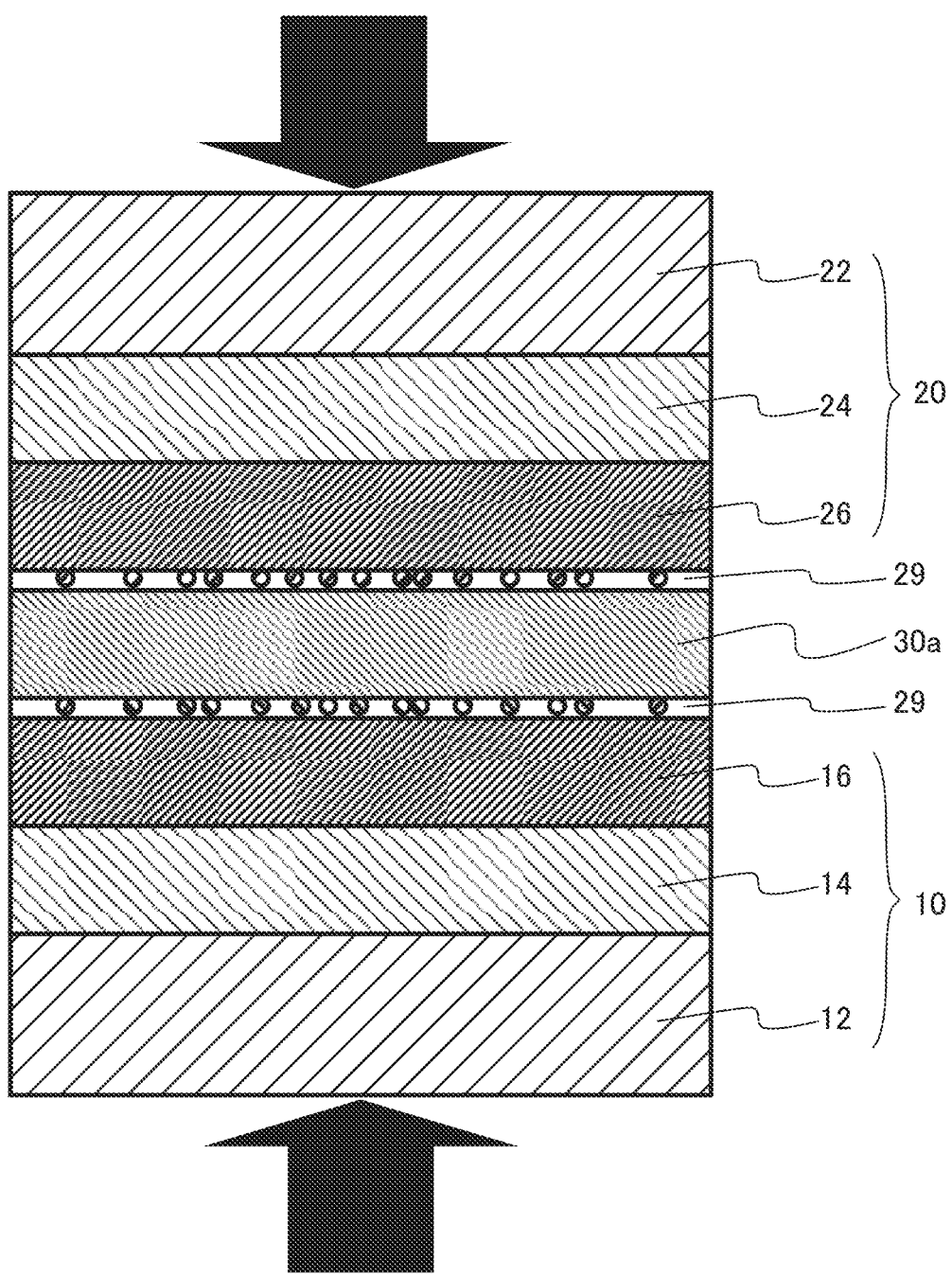
FIG. 7 is a view illustrating a state in which the first superconducting layer and the second superconducting layer are pressurized in the connection method of a superconducting layer according to the first embodiment.

Next, the superposed first superconducting layer 16 and second superconducting layer 26 are pressurized in a direction from the second superconducting layer 26 toward the first superconducting layer 16 (FIG. 7). For example, the pressure is applied by placing a weight on the superposed portion. For example, the pressure is applied using a pressing machine. For example, it is also possible to produce a jig for pressurization and to perform pressurization by sandwiching the jig. When the jig is used, the jig may be removed after the connection, or the jig may remain attached. When the jig is removed, the coil is easily wound, and thus it is preferable to remove the jig.

Next, a heat treatment is performed. The heat treatment is performed in a state where the first superconducting layer 16 and the second superconducting layer 26 are pressurized.

A temperature of the heat treatment is, for example, 300° C. or more and 850° C. or less. For example, the temperature is preferably 400° C. or more and 800° C. or less. The heat treatment is performed, for example, at atmospheric pressure. A first heat treatment is performed, for example, in an air atmosphere, an Ar atmosphere, a nitrogen atmosphere, an oxygen atmosphere, a mixed atmosphere of Ar and oxygen, or a mixed atmosphere of nitrogen and oxygen.

By the heat treatment, the silver oxide particles 29a are sintered while being reduced, and thus, silver particles having a large particle size are formed at the interface between the first superconducting layer 16 and the connection layer 30 and the interface between the second superconducting layer 26 and the connection layer 30.

Next, a second heat treatment may be performed at a second temperature. The second heat treatment is performed in an atmosphere containing oxygen. The second heat treatment is performed in an atmosphere having the same oxygen partial pressure as that of the first heat treatment or an oxygen partial pressure higher than that of the first heat treatment. The second heat treatment is oxygen annealing.

The second temperature is, for example, lower than the first temperature. The second temperature is, for example, 400° C. or more and 600° C. or less. The second heat treatment may be performed by cooling to a temperature lower than the second temperature after the first heat treatment and then reheating to the second temperature. In addition, the second heat treatment may be performed by continuously lowering the temperature to the second temperature after the first heat treatment.

The second heat treatment is performed, for example, in atmospheric pressure. The oxygen partial pressure of the atmosphere of the second heat treatment is, for example, 30% or more.

The first superconducting layer 16 and the second superconducting layer 26 are connected by the above method. By the above method, the connection structure 100 of the first embodiment illustrated in FIG. 1 is formed.

Next, functions and effects of the connection structure of the superconducting layer and the connection method of the superconducting layer of the first embodiment will be described.

For example, in a nuclear magnetic resonance apparatus (NMR) or a magnetic resonance imaging apparatus (MRI), a superconducting coil is used to generate a strong magnetic field. The superconducting coil is formed by winding a superconducting wire around a winding frame.

In order to lengthen the superconducting wire, for example, a plurality of superconducting wires are connected. For example, end portions of two superconducting wires are connected using a connection structure. The connection structure of connecting superconducting wires is required to have low electric resistance and high mechanical strength.

The connection structure 100 of a superconducting layer of the first embodiment uses the connection layer 30 containing the first substance 30a and the second substance 30b. The first substance 30a is a rare earth oxide superconductor. The second substance 30b is a metal. By using the connection layer 30 containing a rare earth oxide superconductor and a metal, the connection structure 100 having low electric resistance and high mechanical strength can be realized.

In the connection method of a superconducting layer according to the first embodiment, the connection layer 30 is formed using silver oxide. By forming the connection layer 30 using silver oxide, the connection structure 100 having low electric resistance and high mechanical strength can be realized. Details will be described below.

Figure 8:
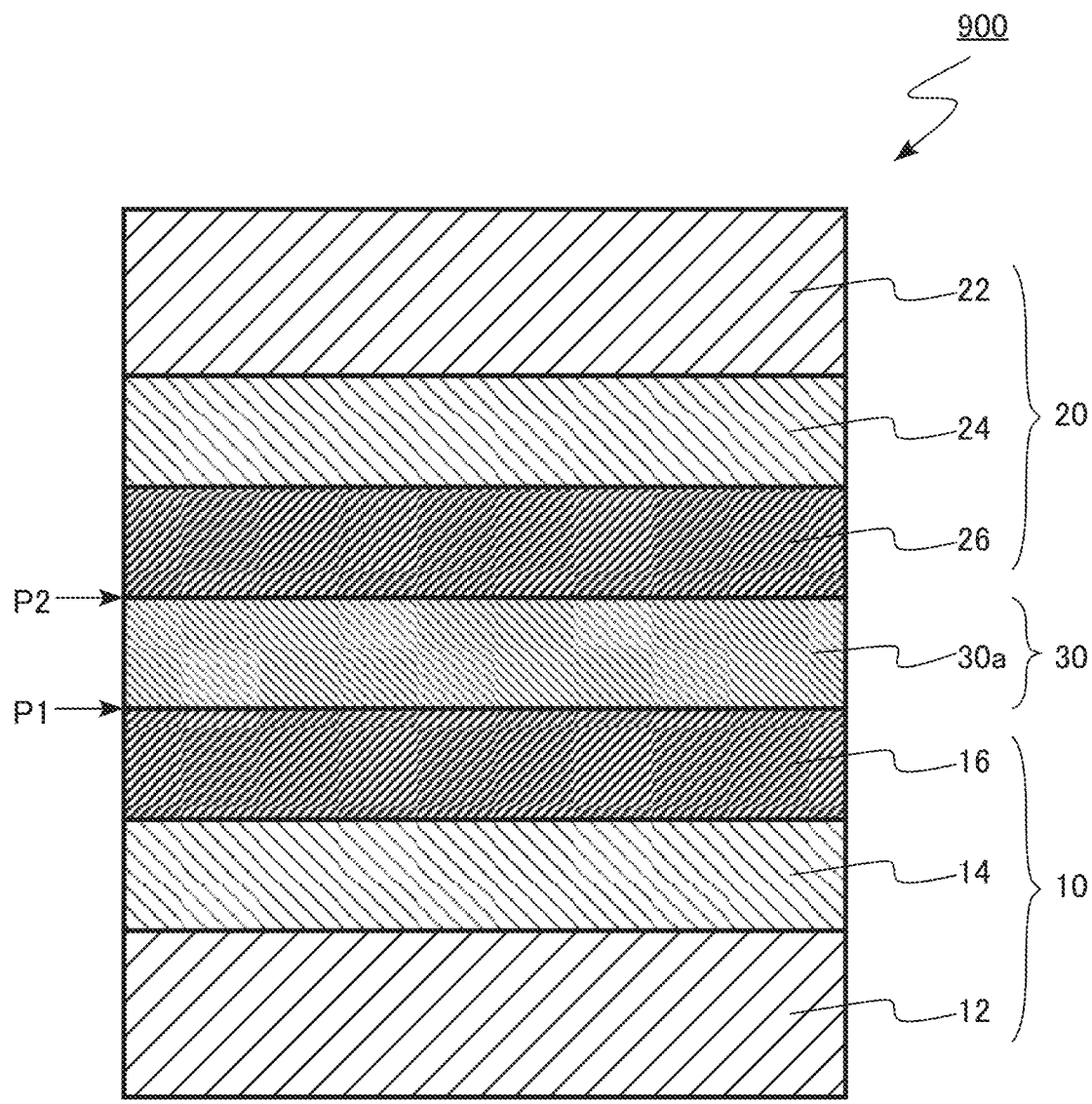
FIG. 8 is a schematic cross-sectional view of a connection structure of a superconducting layer of a comparative example.

FIG. 8 is a schematic cross-sectional view of a connection structure of a superconducting layer of a comparative example. A connection structure 900 of a superconducting layer of the comparative example is different from the connection structure 100 of the first embodiment in that the connection layer 30 does not contain the second substance 30b.

For example, when stress is applied to the connection structure 900, the connection layer 30 and the first superconducting layer 16 may be separated from each other at the first interface (P1 in FIG. 8) between the connection layer 30 and the first superconducting layer 16. When stress is applied to the connection structure 900, the connection layer 30 and the second superconducting layer 26 may be separated from each other at the second interface (P2 in FIG. 8) between the connection layer 30 and the second superconducting layer 26.

In the connection structure 100 of a superconducting layer of the first embodiment, the second substance 30b included in the connection layer 30 is in contact with the first superconducting layer 16, and thus, the connection strength between the connection layer 30 and the first superconducting layer 16 at the first interface P1 increases. In addition, in the connection structure 100 of a superconducting layer of the first embodiment, the second substance 30b included in the connection layer 30 is in contact with the second superconducting layer 26, and thus, the connection strength between the connection layer 30 and the second superconducting layer 26 at the second interface P2 increases. Therefore, the connection structure 100 having high mechanical strength can be realized.

Then, the first substance 30a included in the connection layer 30 is in contact with the first superconducting layer 16, and thus, a path through which the superconductor continues is secured at the first interface P1. In addition, since the first substance 30a included in the connection layer 30 is in contact with the second superconducting layer 26, a path through which the superconductor continues is secured at the second interface P2. Therefore, a contact resistance at the first interface P1 and the second interface P2 is reduced, and the connection structure 100 having low electric resistance can be realized. Therefore, a critical current that can flow in the connection structure 100 increases.

In the first interface P1 between the first superconducting layer 16 and the connection layer 30, the first area ratio is 1% or more and 50% or less. The first area ratio is an area ratio per unit area of the first region where the second substance 30b and the first superconducting layer 16 are in contact with each other. When the first area ratio is less than 1%, connection strength between the connection layer 30 and the first superconducting layer 16 at the first interface P1 is insufficient. When the first area ratio exceeds 50%, the electrical resistance of the connection structure 100 becomes too high.

From the viewpoint of increasing the connection strength between the connection layer 30 and the first superconducting layer 16 at the first interface P1, the first area ratio is preferably 5% or more, and more preferably 8% or more. From the viewpoint of reducing the electric resistance of the connection structure 100, the first area ratio is preferably 30% or less, and more preferably 15% or less.

In the second interface P2 between the second superconducting layer 26 and the connection layer 30, the second area ratio is 1% or more and 50% or less. The second area ratio is an area ratio per unit area of the second region where the second substance 30b and the second superconducting layer 26 are in contact with each other. When the second area ratio is less than 1%, the connection strength between the connection layer 30 and the second superconducting layer 26 at the second interface P2 is insufficient. When the second area ratio exceeds 50%, the electrical resistance of the connection structure 100 becomes too high.

From the viewpoint of increasing the connection strength between the connection layer 30 and the second superconducting layer 26 at the second interface P2, the second area ratio is preferably 5% or more, and more preferably 8% or more. From the viewpoint of reducing the electric resistance of the connection structure 100, the second area ratio is preferably 30% or less, and more preferably 15% or less.

It is preferable that second substance 30b includes a plurality of particles, and the median value of the major diameters of the plurality of particles is 100 nm or more and 10 μm or less. When the median value of the major diameter is 100 nm or more, the connection strength at the first interface P1 or the second interface P2 increases. In addition, since the median value of the major diameter is 10 μm or less, the electrical resistance of the connection structure 100 decreases.

The second substance 30b includes a plurality of particles, and the aspect ratio of the particles in contact with the first interface P1 among the plurality of particles is preferably 5 or more, and more preferably 10 or more. Similarly, among the plurality of particles, the particles in contact with the second interface P2 preferably have an aspect ratio of 5 or more, more preferably 10 or more. When the aspect ratio of the particles exceeds the above lower limit value, it is easy to improve the connection strength between the first interface P1 and the second interface P2 of the connection structure 100 and to reduce the electrical resistance of the connection structure 100.

The major diameter direction of the particles of the second substance 30b is preferably aligned in a direction parallel to the first interface P1 or the second interface P2. In particular, among the plurality of particles, the major diameter of a particle in contact with the first superconducting layer 16 or the second superconducting layer 26 is preferably aligned in a direction parallel to the first interface P1 or the second interface P2.

The major diameter direction of the particles of the second substance 30b is preferably in the range of 0 degrees or more and 30 degrees or less with respect to the first interface P1. In addition, the major diameter direction of the particle is preferably, for example, in the range of 0 degrees or more and 30 degrees or less with respect to the second interface P2.

Since the major diameter direction of the particles of the second substance 30b is aligned in the direction parallel to the first interface P1 or the second interface P2, it is easy to improve the connection strength between the first interface P1 and the second interface P2 of the connection structure 100 and to reduce the electrical resistance of the connection structure 100.

The second substance 30b preferably contains oxygen (O). When the second substance 30b contains oxygen, the mechanical strength of the second substance 30b is improved. Therefore, the mechanical strength of the connection structure 100 is improved.

In addition, the second substance 30b is joined to the first superconducting layer 16, the second superconducting layer 26, and the first substance 30a. Since the first superconducting layer 16, the second superconducting layer 26, and the first substance 30a are all oxides, the second substance 30b contains oxygen, and thus, the first superconducting layer 16, the second superconducting layer 26, and the first substance 30a are easily joined, and joint strength is improved.

The first superconducting layer 16, the second superconducting layer 26, and the first substance 30a are, for example, rare earth oxide superconductors. In the rare earth oxide superconductor, superconducting characteristics are greatly deteriorated due to oxygen defects. Since the second substance 30b contains oxygen, oxygen desorption from the first superconducting layer 16, the second superconducting layer 26, and the first substance 30a is suppressed. Therefore, high superconducting characteristics of the first superconducting layer 16, the second superconducting layer 26, and the first substance 30a can be maintained.

From the viewpoint of improving the mechanical strength of the second substance 30b, from the viewpoint of improving the joint strength of the second substance 30b, and from the viewpoint of maintaining high superconducting characteristics of the first superconducting layer 16, the second superconducting layer 26, and the first substance 30a, the atomic concentration of oxygen (O) contained in the second substance 30b is preferably 0.01% or more, more preferably 0.05% or more, and still more preferably 0.1% or more. Meanwhile, from the viewpoint of reducing the electrical resistance of the second substance 30b, the atomic concentration of oxygen (O) contained in the second substance 30b is preferably 35% or less, more preferably 15% or less, and still more preferably 5% or less.

In the connection method of a superconducting layer according to the first embodiment, the connection layer 30 is formed by performing heat treatment between the first superconducting layer 16 and the first substance 30a and between the second superconducting layer 26 and the first substance 30a with the silver oxide particles 29a interposed therebetween. By the heat treatment, the silver oxide particles 29a are sintered while being reduced, and thus, particles having a large particle size are formed at the interface between the first superconducting layer 16 and the connection layer 30 and the interface between the second superconducting layer 26 and the connection layer 30. The particles having a large particle size are the second substance 30b.

By using the silver oxide particles 29a, for example, sintering of the particles proceeds at a lower temperature as compared with the case of using the silver particles. Therefore, the particles having a large particle size can be formed at a low temperature. Accordingly, it is possible to suppress exposure of the first superconducting layer 16, the second superconducting layer 26, and the first substance 30a formed of an oxide superconductor to a high temperature. Therefore, deterioration of superconducting characteristics of the first superconducting layer 16, the second superconducting layer 26, and the first substance 30a can be suppressed, and the connection structure 100 having low electric resistance and high mechanical strength can be realized.

As described above, according to the connection structure of a superconducting layer and the connection method of a superconducting layer of the first embodiment, low electric resistance and high mechanical strength can be realized.

Second Embodiment

A connection structure of a superconducting layer of a second embodiment is different from the connection structure of the superconducting layer of the first embodiment in that a first substance includes a plurality of particles. Hereinafter, description of contents overlapping with those of the first embodiment may be partially omitted.

Figure 9:
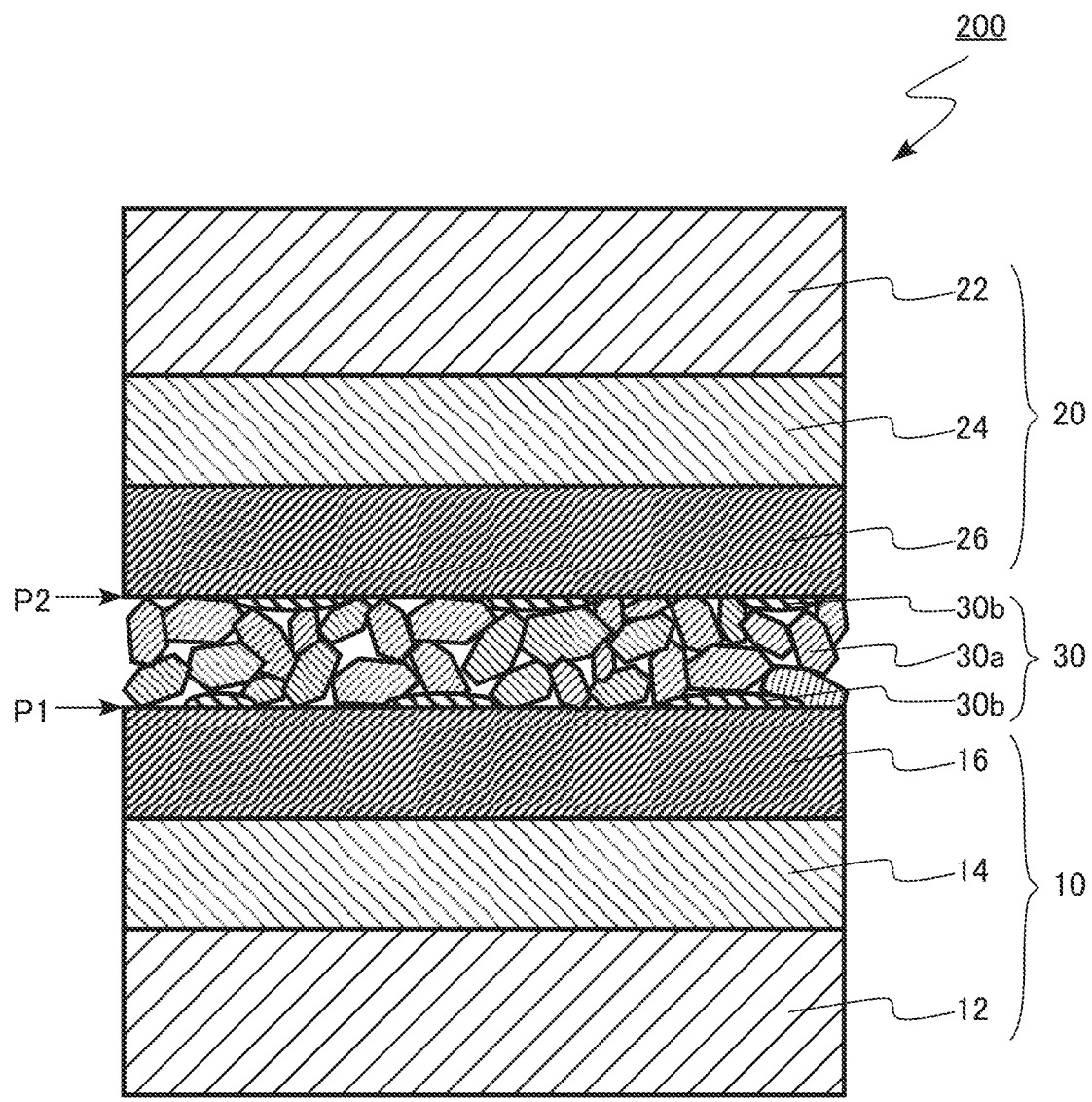
FIG. 9 is a schematic cross-sectional view of a connection structure of a superconducting layer according to a second embodiment.

FIG. 9 is a schematic cross-sectional view of the connection structure of a superconducting layer according to the second embodiment. A connection structure 200 of the second embodiment is a structure which physically and electrically connects two superconducting layers to each other. The connection structure 200 is used, for example, for connecting two superconducting wires and lengthening the superconducting wires.

The connection structure 200 includes a first superconducting member 10, a second superconducting member 20, and a connection layer 30. The connection structure 200 is a structure in which the first superconducting member 10 and the second superconducting member 20 are connected by the connection layer 30. The connection layer 30 is provided between the first superconducting member 10 and the second superconducting member 20.

The connection layer 30 includes a first substance 30a and a second substance 30b.

The first substance 30a includes a plurality of particles. The first substance 30a is, for example, in a state in which a plurality of particles are sintered. Voids are present between the particles.

Each of the plurality of particles is an oxide superconductor. Each of the plurality of particles contains a rare earth element (RE), barium (Ba), copper (Cu), and oxygen (O). The first substance 30a includes, for example, at least one rare earth element (RE) from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Each of the plurality of particles has a chemical composition represented by, for example, $(RE)Ba_2Cu_3O_\delta$ (RE is a rare earth element, $6 \leq \delta \leq 7$). The first substance 30a has, for example, a chemical composition represented by $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$).

Each of the plurality of particles includes, for example, a crystal having a perovskite structure.

The second substance 30b is in contact with the first superconducting layer 16. The second substance 30b is in contact with the second superconducting layer 26.

The second substance 30b is a conductor. The second substance 30b is, for example, a metal.

The second substance 30b contains at least one metal element selected from the group consisting of silver (Ag), aluminum (Al), indium (In), copper (Cu), tin (Sn), and zinc (Zn). The second substance 30b is, for example, silver (Ag).

The second substance 30b contains, for example, oxygen (O). An atomic concentration of oxygen (O) contained in the second substance 30b is, for example, 0.01% or more and 35% or less.

In the first interface P1 between the first superconducting layer 16 and the connection layer 30, an area ratio per unit area of a first region where the second substance 30b and the first superconducting layer 16 are in contact with each other is 1% or more and 50% or less. In addition, in the second interface P2 between the second superconducting layer 26 and the connection layer 30, an area ratio per unit area of a second region where the second substance 30b and the second superconducting layer 26 are in contact with each other is 1% or more and 50% or less.

The second substance 30b includes, for example, a plurality of particles. A median value of major diameters of the plurality of particles is, for example, 100 nm or more and 10 μm or less.

For example, among the plurality of particles, a particle in contact with the first interface P1 has an aspect ratio of 5 or more and 100 or less. Among the plurality of particles, a particle in contact with the second interface P2 has an aspect ratio of 5 or more and 100 or less.

Next, an example of a connection method of a superconducting layer according to a second embodiment will be described. The connection method of the superconducting layer of the second embodiment is a method for forming the connection structure 200.

The connection method of a superconducting layer is the same as that of the first embodiment until the first superconducting layer 16 and the second superconducting layer 26 are prepared and removed using the first protective layer 18 and the second protective layer 28.

Next, a slurry is prepared. The slurry includes first crystal particles, first particles, second particles, third particles, and silver oxide particles.

The first crystal particle finally becomes a portion of the first substance 30a. The silver oxide particles finally become the second substance 30b.

The first crystal particle contains a rare earth element (RE), barium (Ba), copper (Cu), and oxygen (O). The first crystal particle is a rare earth oxide. The first crystal particle is, for example, a single crystal or a polycrystal having a perovskite structure. The first crystal particle has, for example, a chemical composition represented by (RE)Ba$_2$Cu$_3$O$_\delta$ (RE is a rare earth element, 6≤δ≤7).

The first crystal particle has, for example, a plate shape or a flat shape. The median value of the particle size of the first crystal particles is, for example, 100 nm or more and 10 μm or less.

The first crystal particles are formed, for example, by pulverizing a superconductor of a rare earth oxide. The rare earth oxide superconductor is formed, for example, by firing a powder raw material.

The first crystal particle is, for example, a composite of a powder obtained by pulverizing a sintered body of a rare earth oxide superconductor and a rare earth oxide superconductor prepared by a MOD method. For example, a composite can be produced by applying an MOD solution to a sintered powder of GdBa$_2$Cu$_3$O$_\delta$ (6≤δ≤7) and performing a heat treatment. The temperature of the heat treatment is, for example, 700° C. or more and 850° C. or less.

The heat treatment is performed, for example, at atmospheric pressure. The heat treatment is performed, for example, in an air atmosphere, an Ar atmosphere, a nitrogen atmosphere, an oxygen atmosphere, a mixed atmosphere of Ar and oxygen, or a mixed atmosphere of nitrogen and oxygen. By using the composite, electrical connectivity between the connection layer 30 and the first superconducting layer 16 and the second superconducting layer 26 is improved, and an electrical resistance can be reduced.

The first particles contain a rare earth element (RE) and oxygen (O). The first particle has, for example, a chemical composition represented by RE$_2$O$_3$ (RE is a rare earth element).

The second particles contain barium (Ba), carbon (C), and oxygen (O). The second particle has, for example, a chemical composition represented by BaCO$_3$.

The third particle contains copper (Cu) and oxygen (O). The third particle has, for example, a chemical composition represented by CuO.

The slurry 29 contains, for example, a sintering aid and a thickener. The sintering aid is, for example, sodium alginate.

Next, the slurry is applied onto the second superconducting layer 26.

Next, for example, the second superconducting layer 26 is reversed, and the first superconducting layer 16 and the second superconducting layer 26 face each other with the slurry interposed therebetween. Then, the first superconducting layer 16 and the second superconducting layer 26 are superposed.

Next, the superposed first superconducting layer 16 and second superconducting layer 26 are pressurized in a direction from the second superconducting layer 26 toward the first superconducting layer 16.

Next, a first heat treatment is performed at a first temperature. The first heat treatment is performed in a state where the first superconducting layer 16 and the second superconducting layer 26 are pressurized.

The first temperature is, for example, 500° C. or more and 850° C. or less. For example, the temperature is preferably 600° C. or more and 800° C. or less. The first heat treatment is performed, for example, at atmospheric pressure. A first heat treatment is performed, for example, in an air atmosphere, an Ar atmosphere, a nitrogen atmosphere, an oxygen atmosphere, a mixed atmosphere of Ar and oxygen, or a mixed atmosphere of nitrogen and oxygen.

By the first heat treatment, the first particles, the second particles, and the third particles react to form second crystal particles that are superconductors. The first particle, the second particle, and the third particle are raw materials of the second crystal particles which are superconductors. The second crystal particle finally becomes a portion of the first substance 30a.

The second crystal particles 32 contain a rare earth element (RE), barium (Ba), copper (Cu), and oxygen (O). The second crystal particle 32 is a rare earth oxide. The second crystal particle 32 is, for example, a single crystal or a polycrystal having a perovskite structure. The second crystal particle 32 has, for example, a chemical composition represented by (RE)Ba$_2$Cu$_3$O$_\delta$ (RE is a rare earth element, 6≤δ≤7).

The second crystal particle 32 has, for example, a spherical shape or an indefinite shape. The median value of the particle sizes of the second crystal particles 32 is smaller than the median value of the particle sizes of the first crystal particles 31. The median value of the particle sizes of the second crystal particles 32 is, for example, 10 nm or more and less than 1 μm.

Note that, for example, the first particles, the second particles, and the third particles that have not contributed to the formation of the second crystal particles remain in the connection layer 30.

The first crystal particle and the second crystal particle are sintered by the first heat treatment.

By the first heat treatment, the silver oxide particles are sintered while being reduced, and thus, silver particles having a large particle size are formed at the interface between the first superconducting layer 16 and the connection layer 30 and the interface between the second superconducting layer 26 and the connection layer 30.

Next, a second heat treatment is performed at the second temperature. The second heat treatment is performed in an atmosphere containing oxygen. The second heat treatment is performed in an atmosphere having the same oxygen partial pressure as that of the first heat treatment or an oxygen partial pressure higher than that of the first heat treatment. The second heat treatment is oxygen annealing.

The second temperature is, for example, lower than the first temperature. The second temperature is, for example, 400° C. or more and 600° C. or less. The second heat treatment may be performed by cooling to a temperature lower than the second temperature after the first heat treatment and then reheating to the second temperature. In addition, the second heat treatment may be performed by continuously lowering the temperature to the second temperature after the first heat treatment.

The second heat treatment is performed, for example, in atmospheric pressure. The oxygen partial pressure of the atmosphere of the second heat treatment is, for example, 30% or more.

The connection layer 30 is formed by the first heat treatment and the second heat treatment.

The first superconducting layer 16 and the second superconducting layer 26 are connected by the above method. The connection structure 200 of the second embodiment is formed by the above method.

As described above, according to the connection structure of a superconducting layer and the connection method of a superconducting layer of the second embodiment, low electric resistance and high mechanical strength can be realized.

Third Embodiment

A connection structure of a superconducting layer according to a third embodiment includes a first superconducting layer, a second superconducting layer, and a connection layer provided between the first superconducting layer and the second superconducting layer and including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn), in which the second substance is in contact with the first superconducting layer and the second superconducting layer, and the second substance is continuous between the first superconducting layer and the second superconducting layer. The connection structure of a superconducting layer of the third embodiment is different from the connection structure of a superconducting layer of the first embodiment in that the second substance is continuous between the first superconducting layer and the second superconducting layer. Hereinafter, description of contents overlapping with those the first embodiment will be partially omitted.

Figure 10:
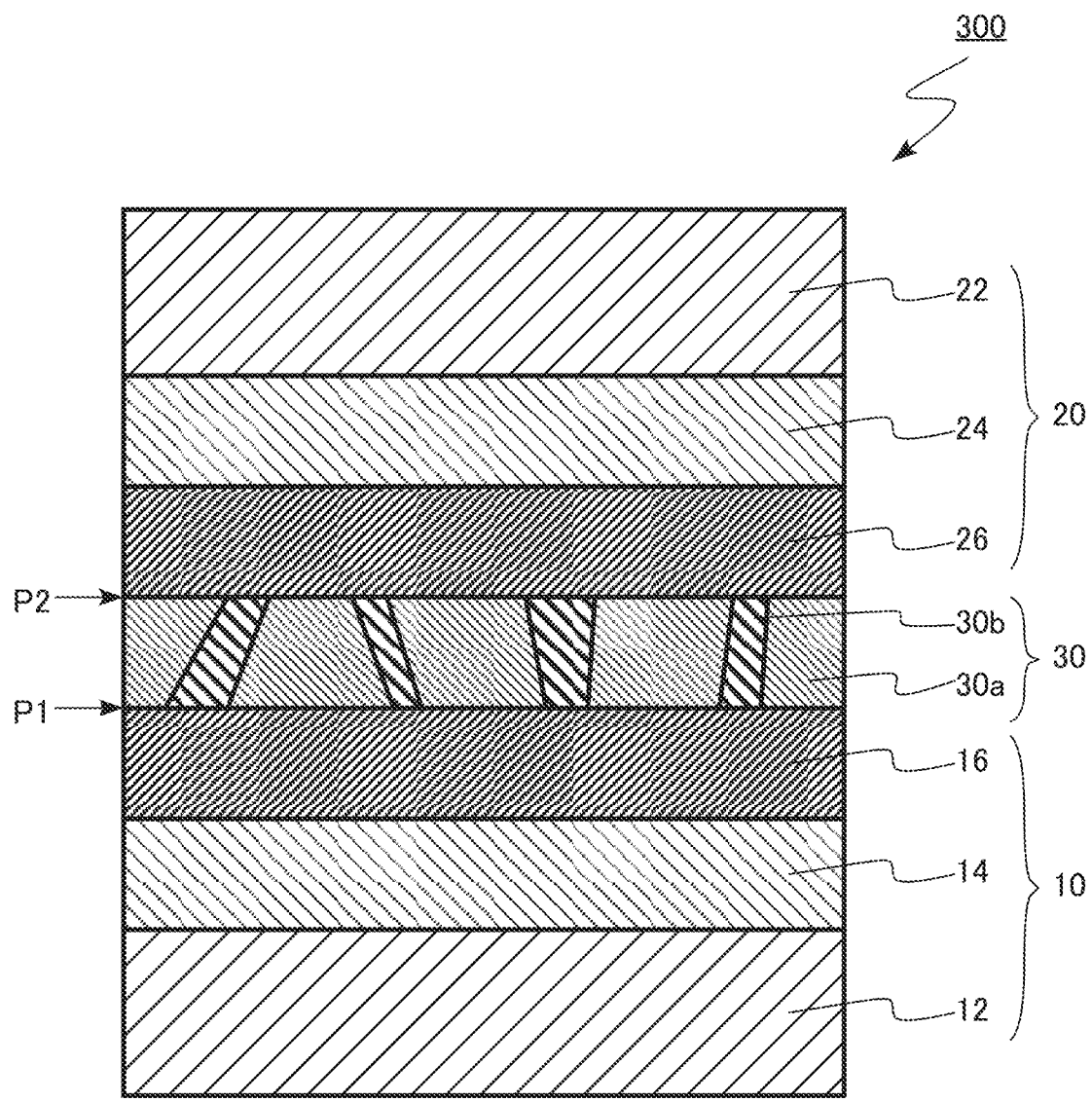
FIG. 10 is a schematic cross-sectional view of a connection structure of a superconducting layer according to a third embodiment.

FIG. 10 is a schematic cross-sectional view of the connection structure of a superconducting layer of the third embodiment. A connection structure 300 of the third embodiment is a structure that physically and electrically connects two superconducting layers. The connection structure 300 is used, for example, for connecting two superconducting wires and lengthening the superconducting wires.

The connection structure 300 includes a first superconducting member 10, a second superconducting member 20, and a connection layer 30. The connection structure 300 is a structure in which the first superconducting member 10 and the second superconducting member 20 are connected by the connection layer 30. The connection layer 30 is provided between the first superconducting member 10 and the second superconducting member 20.

The connection layer 30 includes a first substance 30a and a second substance 30b.

The first substance 30a includes a plurality of particles. The first substance 30a is, for example, in a state in which a plurality of particles are sintered.

Each of the plurality of particles is an oxide superconductor. Each of the plurality of particles contains a rare earth element (RE), barium (Ba), copper (Cu), and oxygen (O). The first substance 30a includes, for example, at least one rare earth element (RE) from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Each of the plurality of particles has a chemical composition represented by, for example, $(RE)Ba_2Cu_3O_\delta$ (RE is a rare earth element, $6 \leq \delta \leq 7$). The first substance 30a has, for example, a chemical composition represented by $GdBa_2Cu_3O_\delta$ ($6 \leq \delta \leq 7$), $YBa_2Cu_3O_\delta$ ($6 \leq \delta \leq 7$), or $EuBa_2Cu_3O_\delta$ ($6 \leq \delta \leq 7$).

Each of the plurality of particles includes, for example, a crystal having a perovskite structure.

The second substance 30b is in contact with the first superconducting layer 16. The second substance 30b is in contact with the second superconducting layer 26. The second substance 30b is continuous between the first superconducting layer 16 and the second superconducting layer 26.

The second substance 30b is a conductor. The second substance 30b is, for example, a metal.

The second substance 30b contains at least one metal element selected from the group consisting of silver (Ag), aluminum (Al), indium (In), copper (Cu), tin (Sn), and zinc (Zn). The second substance 30b is, for example, silver (Ag).

The second substance 30b contains, for example, oxygen (O). An atomic concentration of oxygen (O) contained in the second substance 30b is, for example, 0.01% or more and 35% or less.

In a cross section parallel to a direction from the first superconducting layer 16 toward the second superconducting layer 26, an area ratio per unit area of the second substance 30b is, for example, 5% or more and 50% or less.

In the first interface P1 between the first superconducting layer 16 and the connection layer 30, the area ratio per unit area of the first region where the second substance 30b and the first superconducting layer 16 are in contact with each other per unit area is, for example, 1% or more and 50% or less. In addition, in the second interface P2 between the second superconducting layer 26 and the connection layer 30, the area ratio per unit area of the second region where the second substance 30b and the second superconducting layer 26 are in contact with each other is, for example, 1% or more and 50% or less.

The connection structure 300 of the superconducting layer of the third embodiment can be formed, for example, by adjusting a size of the first crystal particle, a shape of the first crystal particle, an amount ratio between the first crystal particle and the silver oxide particle, and the like in the connection method of the superconducting layer of the second embodiment.

For example, in the connection method of a superconducting layer according to the second embodiment, the connection structure 300 can be formed by relatively increasing the sizes of the first crystal particles and relatively increasing the amount of silver oxide particles.

In the connection structure 300, since the second substance 30b is continuous between the first superconducting layer 16 and the second superconducting layer 26, higher mechanical strength can be realized as compared with the connection structure 100 of the first embodiment.

In the cross section parallel to the direction from the first superconducting layer 16 toward the second superconducting layer 26, the area ratio per unit area of the second substance 30b is preferably 5% or more, and more preferably 10% or more. When the area ratio exceeds the above lower limit value, the mechanical strength of the connection structure 300 further increases.

In the cross section parallel to the direction from the first superconducting layer 16 toward the second superconducting layer 26, the area ratio per unit area of the second substance 30b is preferably 50% or less, more preferably 40% or less, and still more preferably 30% or less. When the area ratio falls below the upper limit value, the electrical resistance of the connection structure 300 further decreases.

As described above, according to the connection structure of a superconducting layer and the connection method of a superconducting layer of the third embodiment, low electric resistance and high mechanical strength can be realized.

Fourth Embodiment

A superconducting wire of a fourth embodiment includes a first superconducting wire including a first superconducting layer, a second superconducting wire including a second superconducting layer, a third superconducting layer having a first surface and a second surface facing the first surface, and a connection layer provided between the first superconducting layer and the third superconducting layer and between the second superconducting layer and the third superconducting layer and including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn). Further, the first superconducting layer and the second superconducting layer are located on a side of the first surface of the third superconducting layer, a first area ratio at a first interface between the first superconducting layer and the connection layer is 1% or more and 50% or less, the first area ratio is an area ratio of a first region per unit area, the first region is a region where the second substance and the first superconducting layer are in contact with each other, and a second area ratio at a second interface between the second superconducting layer and the connection layer is 1% or more and 50% or less, the second area ratio is an area ratio of a second region per unit area, the second region is a region where the second substance and the second superconducting layer are in contact with each other, a third area ratio at a third interface between the third superconducting layer and the connection layer is 1% or more and 50% or less, the third area ratio is an area ratio of a third region per unit area, the third region is a region where the second substance and the third superconducting layer are in contact with each other. The superconducting wire of the fourth embodiment uses the connection structure of the superconducting layer of the first embodiment as a structure for connecting the first superconducting wire and the second superconducting wire. Hereinafter, description of contents overlapping with those the first embodiment will be partially omitted.

Figure 11:
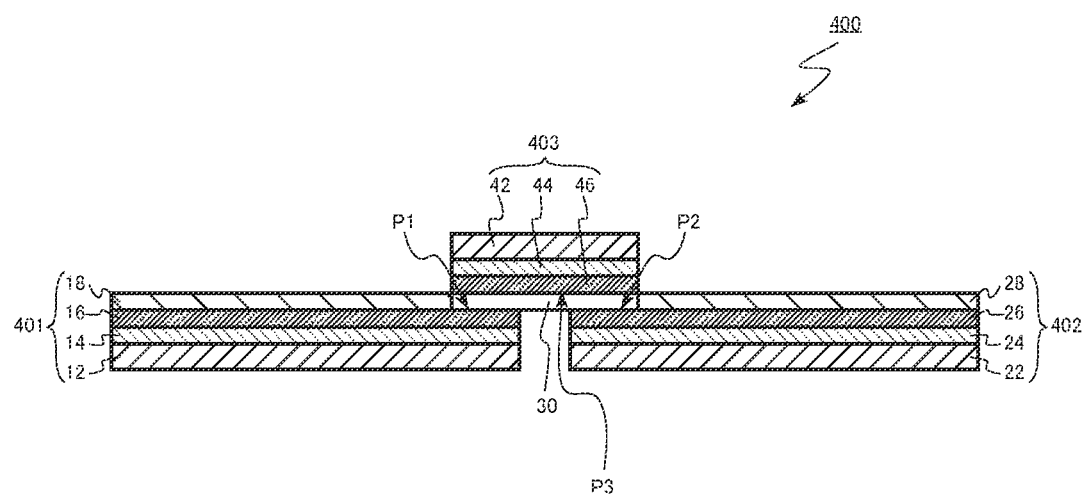
FIG. 11 is a schematic cross-sectional view of a superconducting wire of a fourth embodiment.

FIG. 11 is a schematic cross-sectional view of the superconducting wire of the fourth embodiment. A superconducting wire 400 of the fourth embodiment includes a first superconducting wire 401, a second superconducting wire 402, and a connection member 403. The superconducting wire 400 of the fourth embodiment is lengthened by connecting the first superconducting wire 401 and the second superconducting wire 402 using the connection member 403.

The first superconducting wire 401 includes a first substrate 12, a first intermediate layer 14, a first superconducting layer 16, and a first protective layer 18. The second superconducting wire 402 includes a second substrate 22, a second intermediate layer 24, a second superconducting layer 26, and a second protective layer 28. The connection member 403 includes a third substrate 42, a third intermediate layer 44, and a third superconducting layer 46.

The first substrate 12 is, for example, metal. The first substrate 12 is, for example, a nickel alloy or a copper alloy. The first substrate 12 is, for example, a nickel-tungsten alloy.

The first superconducting layer 16 is, for example, an oxide superconducting layer. The first superconducting layer 16 contains, for example, a rare earth element (RE), barium (Ba), copper (Cu), and oxygen (O). The first superconducting layer 16 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first superconducting layer 16 includes, for example, a single crystal having a perovskite structure.

The first superconducting layer 16 is formed on the first intermediate layer 14 by, for example, the MOD method, the PLD method, or the MOCVD method.

The first intermediate layer 14 is provided between the first substrate 12 and the first superconducting layer 16. The first intermediate layer 14 is in contact with, for example, the first superconducting layer 16. The first intermediate layer 14 has a function of improving a crystal orientation of the first superconducting layer 16 formed on the first intermediate layer 14.

The first intermediate layer 14 contains, for example, a rare earth oxide. The first intermediate layer 14 has, for example, a stacked structure of a plurality of films. The first intermediate layer 14 has, for example, a structure in which yttrium oxide ($Y_2O_3$), yttria stabilized zirconia (YSZ), and cerium oxide ($CeO_2$) are laminated from the first substrate 12 side.

The first protective layer 18 is provided on the first superconducting layer 16. The first protective layer 18 is in contact with, for example, the first superconducting layer 16. The first protective layer 18 has a function of protecting the first superconducting layer 16.

The first protective layer 18 is, for example, a metal, and the first protective layer 18 contains, for example, silver (Ag) or copper (Cu).

The second substrate 22 is, for example, metal. The second substrate 22 is, for example, a nickel alloy or a copper alloy. The second substrate 22 is, for example, a nickel-tungsten alloy.

The second superconducting layer 26 is, for example, an oxide superconducting layer. The second superconducting layer 26 contains, for example, a rare earth element (RE), barium (Ba), copper (Cu), and oxygen (O). The second superconducting layer 26 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The second superconducting layer 26 includes, for example, a single crystal having a perovskite structure.

The second superconducting layer 26 is formed on the second intermediate layer 24 by, for example, a metal-organic deposition MOD method, a PLD method, or an MOCVD method.

The second intermediate layer 24 is provided between the second substrate 22 and the second superconducting layer 26. The second intermediate layer 24 is in contact with, for example, the second superconducting layer 26. The second intermediate layer 24 has a function of improving a crystal orientation of the second superconducting layer 26 formed on the second intermediate layer 24.

The second intermediate layer 24 contains, for example, a rare earth oxide. The second intermediate layer 24 has, for example, a stacked structure of a plurality of films. The second intermediate layer 24 has, for example, a structure in which yttrium oxide ($Y_2O_3$), yttria stabilized zirconia (YSZ), and cerium oxide ($CeO_2$) are laminated from the second substrate 22 side.

The second protective layer 28 is provided on the second superconducting layer 26. The second protective layer 28 is in contact with, for example, the second superconducting layer 26. The second protective layer 28 has a function of protecting the second superconducting layer 26.

The second protective layer 28 is, for example, a metal, and the second protective layer 28 contains, for example, silver (Ag) or copper (Cu).

The third substrate 42 is, for example, metal. The third substrate 42 is, for example, a nickel alloy or a copper alloy. The third substrate 42 is, for example, a nickel-tungsten alloy.

The third superconducting layer 46 has a first surface and a second surface. The first superconducting layer 16 and the second superconducting layer 26 are located on a side of the first surface of the third superconducting layer 46. In FIG. 11, the first surface is a lower surface of the third superconducting layer 46, and the second surface is an upper surface of the third superconducting layer 46. The first superconducting layer 16 and the second superconducting layer 26 are located on the lower surface side of the third superconducting layer 46.

The third superconducting layer 46 is, for example, an oxide superconducting layer. The third superconducting layer 46 contains, for example, a rare earth element (RE), barium (Ba), copper (Cu), and oxygen (O). The third superconducting layer 46 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The third superconducting layer 46 includes, for example, a single crystal having a perovskite structure.

The third superconducting layer 46 is formed on the third intermediate layer 44 by, for example, the MOD method, the PLD method, or the MOCVD method.

The third intermediate layer 44 is provided between the third substrate 42 and the third superconducting layer 46. The third intermediate layer 44 is in contact with, for example, the third superconducting layer 46. The third intermediate layer 44 has a function of improving a crystal orientation of the third superconducting layer 46 formed on the third intermediate layer 44.

The third intermediate layer 44 contains, for example, a rare earth oxide. The third intermediate layer 44 has, for example, a stacked structure of a plurality of films. The third intermediate layer 44 has, for example, a structure in which yttrium oxide ($Y_2O_3$), yttria stabilized zirconia (YSZ), and cerium oxide ($CeO_2$) are laminated from the third substrate 42 side.

For example, a protective layer in contact with the third superconducting layer 46 is not provided. For example, a metal protective layer in contact with the third superconducting layer 46 is not provided. For example, a protective layer containing silver (Ag) or copper (Cu) in contact with the third superconducting layer 46 is not provided.

The connection layer 30 is provided between the first superconducting layer 16 and the third superconducting layer 46. The connection layer 30 is in contact with the first superconducting layer 16. The connection layer 30 is in contact with the third superconducting layer 46.

The connection layer 30 is provided between the second superconducting layer 26 and the third superconducting layer 46. The connection layer 30 is in contact with the second superconducting layer 26. The connection layer 30 is in contact with the third superconducting layer 46.

An interface between the first superconducting layer 16 and the connection layer 30 is a first interface (P1 in FIG. 11). An interface between the second superconducting layer 26 and the connection layer 30 is a second interface (P2 in FIG. 11). An interface between the third superconducting layer 46 and the connection layer 30 is a third interface (P3 in FIG. 11).

The connection layer 30 between the first superconducting layer 16 and the third superconducting layer 46 and the connection layer 30 between the second superconducting layer 26 and the third superconducting layer 46 are continuous.

The connection layer 30 is not present, for example, between the first superconducting layer 16 and the second superconducting layer 26. A gap between the first superconducting layer 16 and the second superconducting layer 26 is, for example, an air gap.

The connection layer 30 of the fourth embodiment has the same configuration as the connection layer 30 of the first embodiment illustrated in FIG. 1.

The connection layer 30 includes a first substance 30a and a second substance 30b.

The first substance 30a is in contact with the first superconducting layer 16. The first substance 30a is in contact with the second superconducting layer 26. The first substance 30a is in contact with the third superconducting layer 46.

The first substance 30a is an oxide superconductor. The first substance 30a contains a rare earth element (RE), barium (Ba), copper (Cu), and oxygen (O). The first substance 30a includes, for example, at least one rare earth element (RE) from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first substance 30a has, for example, a chemical composition represented by $(RE)Ba_2Cu_3O_\delta$ (RE is a rare earth element, $6 \leq \delta \leq 7$). The first substance 30a has, for example, a chemical composition represented by $GdBa_2Cu_3O_\delta$ (6≤δ≤7), $YBa_2Cu_3O_\delta$ (6≤δ≤7), or $EuBa_2Cu_3O_\delta$ (6≤δ≤7).

The first substance 30a includes, for example, a crystal having a perovskite structure.

The first substance 30a has, for example, a plate shape.

The second substance 30b is in contact with the first superconducting layer 16. The second substance 30b is in contact with the second superconducting layer 26. The second substance 30b is in contact with the third superconducting layer 46.

The second substance 30b is a conductor. The second substance 30b is, for example, a metal.

The second substance 30b contains at least one metal element selected from the group consisting of silver (Ag), aluminum (Al), indium (In), copper (Cu), tin (Sn), and zinc (Zn). The second substance 30b is, for example, silver (Ag).

The second substance 30b contains, for example, oxygen (O). An atomic concentration of oxygen (O) contained in the second substance 30b is, for example, 0.01% or more and 35% or less.

In the first interface P1 between the first superconducting layer 16 and the connection layer 30, an area ratio per unit area of a first region where the second substance 30b and the first superconducting layer 16 are in contact with each other is 1% or more and 50% or less. In addition, in the second interface P2 between the second superconducting layer 26 and the connection layer 30, an area ratio per unit area of a second region where the second substance 30b and the second superconducting layer 26 are in contact with each other is 1% or more and 50% or less. In the third interface P3 between the third superconducting layer 46 and the connection layer 30, an area ratio per unit area of a third region where the second substance 30b and the third superconducting layer 46 are in contact with each other is 1% or more and 50% or less.

The second substance 30b includes, for example, a plurality of particles. A median value of major diameters of the plurality of particles is, for example, 100 nm or more and 10 µm or less.

For example, among the plurality of particles, a particle in contact with the first interface P1 has an aspect ratio of 5 or more and 100 or less. Among the plurality of particles, a particle in contact with the second interface P2 has an aspect ratio of 5 or more and 100 or less.

In the superconducting wire 400 of the fourth embodiment, for example, a current flows from the first superconducting wire 401 to the second superconducting wire 402 through the connection layer 30, the connection member 403, and the connection layer 30.

Since the first superconducting wire 401 and the connection member 403 are connected by using the connection layer 30, the connection structure of connecting the first superconducting wire 401 and the connection member 403 has low electric resistance and high mechanical strength. In addition, since the second superconducting wire 402 and the connection member 403 are connected by using the connection layer 30, the connection structure of connecting the second superconducting wire 402 and the connection member 403 has low electric resistance and high mechanical strength.

Therefore, the connection structure of connecting the first superconducting wire 401 and the second superconducting wire 402 has low electric resistance and high mechanical strength. Accordingly, the superconducting wire 400 has low electric resistance and high mechanical strength.

It is also possible to connect three or more superconducting wires to form a further lengthened superconducting wire.

In the superconducting wire of the fourth embodiment, the case of using the connection structure of the superconducting layer of the first embodiment has been described as an example, but it is also possible to use the connection structure of the second embodiment instead of the connection structure of the superconducting layer of the first embodiment. That is, it is also possible to use the connection layer described in the second embodiment for the connection layer 30.

First Modification

Figure 12:
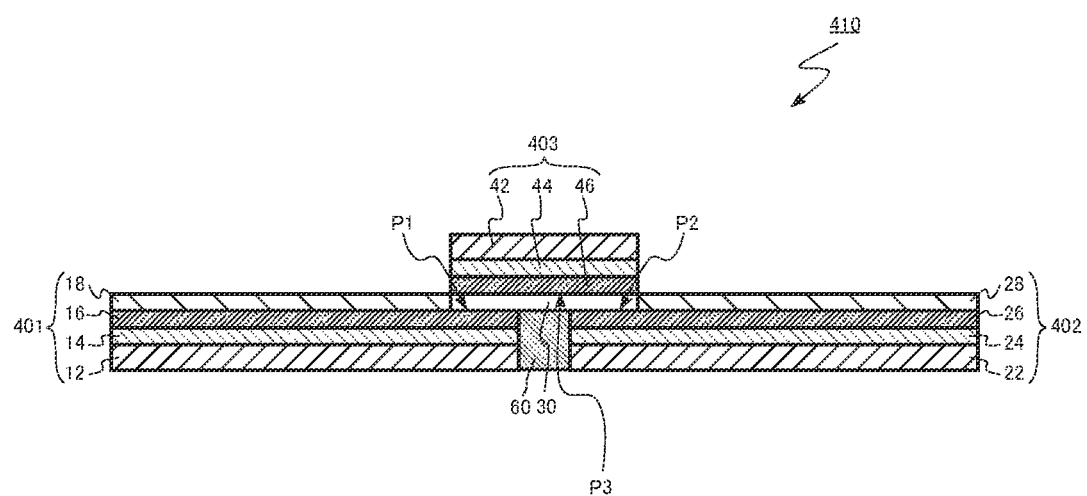
FIG. 12 is a schematic cross-sectional view of a first modification of the superconducting wire of the fourth embodiment.

FIG. 12 is a schematic cross-sectional view of a first modification of the superconducting wire of the fourth embodiment. A superconducting wire 410 of a modification of the fourth embodiment is different from the superconducting wire 400 of the fourth embodiment in including a reinforcing material 60.

The reinforcing material 60 is provided between the first superconducting wire 401 and the second superconducting wire 402. The reinforcing material 60 is provided, for example, between the first superconducting layer 16 and the second superconducting layer 26.

The reinforcing material 60 is in contact with, for example, the first superconducting wire 401 and the second superconducting wire 402. The reinforcing material 60 is in contact with, for example, the connection layer 30.

By providing the reinforcing material 60, the mechanical strength of the superconducting wire 410 is improved.

The reinforcing material 60 is, for example, metal or resin. The reinforcing material 60 is, for example, solder. The reinforcing material 60 is, for example, solder containing silver (Ag) and indium (In).

Second Modification

Figure 13:
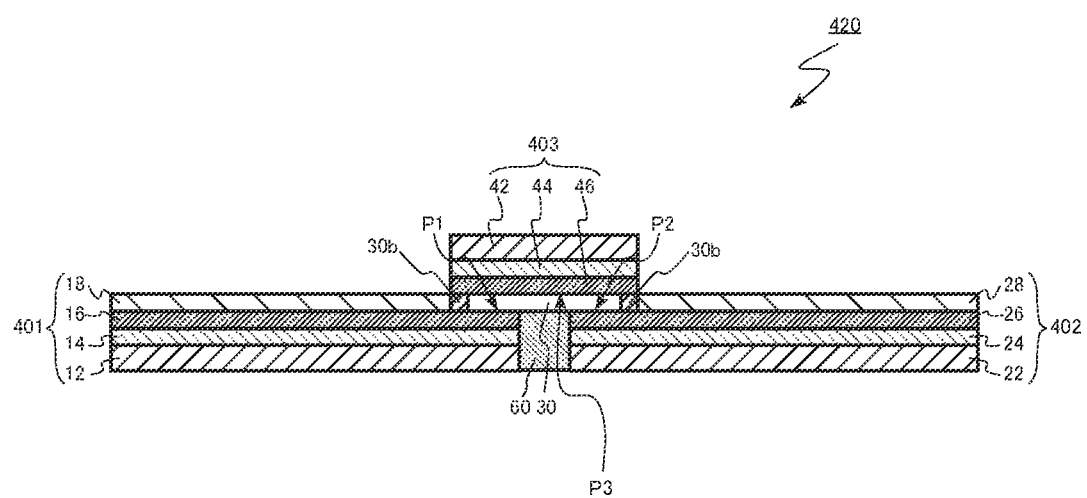
FIG. 13 is a schematic cross-sectional view of a second modification of the superconducting wire of the fourth embodiment.

FIG. 13 is a schematic cross-sectional view of a modification of the superconducting wire of the fourth embodiment. A superconducting wire 420 of a modification of the fourth embodiment is different from the superconducting wire 400 of the fourth embodiment in that a second substance 30b is disposed at both end portions of a connection layer 30.

The second substance 30b disposed at the end portion of the connection layer 30 is continuously provided, for example, between the first superconducting layer 16 and the superconducting layer 46 of the connection member 403. In addition, the second substance 30b is continuously provided between the second superconducting layer 26 and the superconducting layer 46 of the connection member 403.

By disposing the second substance 30b at the end portion of the connection layer 30, stress applied to the first superconducting layer 16 and the second superconducting layer 26 facing each other can be dispersed when pressure is applied from above and below. As a result, cracks generated in the first superconducting layer 16 and the second superconducting layer 26 can be suppressed, and a superconducting wire having high mechanical strength can be realized. It is also effective in obtaining a high critical current.

As described above, according to the fourth embodiment, it is possible to realize the superconducting wire lengthened by connecting two superconducting wires and having low electric resistance and high mechanical strength.

Fifth Embodiment

A superconducting wire of a fifth embodiment includes a first superconducting wire including a first superconducting layer, a second superconducting wire including a second superconducting layer, a third superconducting layer having a first surface and a second surface facing the first surface, and a connection layer provided between the first superconducting layer and the third superconducting layer and between the second superconducting layer and the third superconducting layer and including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn). Then, the first superconducting layer and the second superconducting layer are located on a side of the first surface of the third superconducting layer, a portion of the second substance is in contact with the first superconducting layer and the third superconducting layer, the portion of the second substance is continuous between the first superconducting layer and the third superconducting layer, a different portion of the second substance is in contact with the second superconducting layer and the third superconducting layer, and the different portion of the second substance is continuous between the second superconducting layer and the third superconducting layer. The superconducting wire of a fifth embodiment is different from the superconducting wire of the fourth embodiment in that a connection layer similar to that of the third embodiment is provided in the connection layer. Hereinafter, description of contents overlapping with those of the fourth embodiment will be partially omitted.

The superconducting wire of the fifth embodiment has the same structure as the superconducting wire 400 of the fourth embodiment illustrated in FIG. 11. A connection layer 30 of the fifth embodiment has the same configuration as the connection layer 30 of the third embodiment illustrated in FIG. 10.

A portion of a second substance 30b is in contact with a first superconducting layer 16 and a third superconducting layer 46, and the portion of the second substance 30b is continuous between the first superconducting layer 16 and the third superconducting layer 46. The portion of the second substance 30b is present in the connection layer 30 between the first superconducting layer 16 and the third superconducting layer 46.

A different portion of the second substance 30b is in contact with the second superconducting layer 26 and the third superconducting layer 46, and the different portion of the second substance 30b is continuous between the second superconducting layer 26 and the third superconducting layer 46. The different portion of the second substance 30b is present in the connection layer 30 between the second superconducting layer 26 and the third superconducting layer 46.

As described above, according to the fifth embodiment, it is possible to realize a superconducting wire lengthened by connecting two superconducting wires and having low electric resistance and high mechanical strength.

Sixth Embodiment

A superconducting wire of a sixth embodiment is different from the superconducting wire of the fourth or fifth embodiment in that a connection layer includes a first portion and a second portion separated from each other. Hereinafter, description overlapping with those of the fourth or fifth embodiment will partially be omitted.

Figure 14:
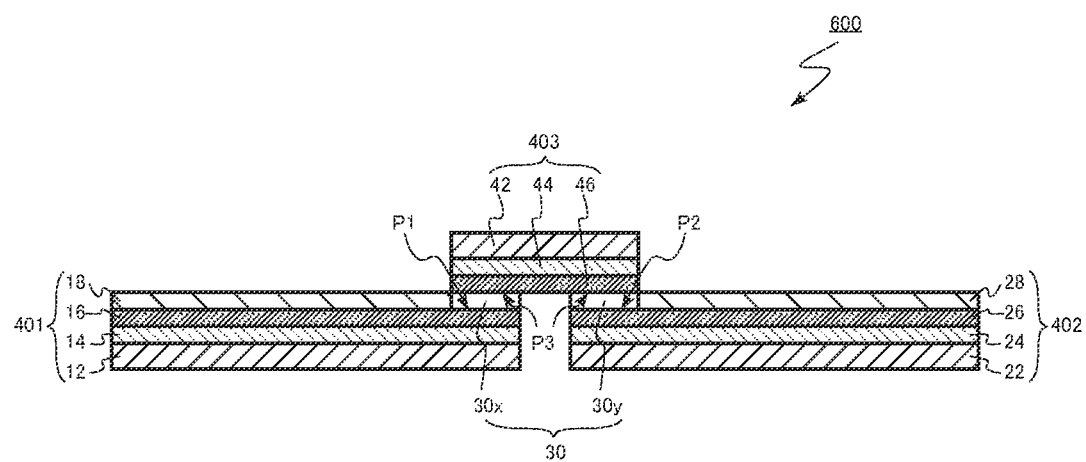
FIG. 14 is a schematic cross-sectional view of a superconducting wire of a sixth embodiment.

FIG. 14 is a schematic cross-sectional view of a superconducting wire of the sixth embodiment. A superconducting wire 600 of the sixth embodiment includes a first superconducting wire 401, a second superconducting wire 402, and a connection member 403. The superconducting wire 600 of the sixth embodiment is lengthened by connecting the first superconducting wire 401 and the second superconducting wire 402 using the connection member 403.

The first superconducting wire 401 includes a first substrate 12, a first intermediate layer 14, a first superconducting layer 16, and a first protective layer 18. The second superconducting wire 402 includes a second substrate 22, a second intermediate layer 24, a second superconducting layer 26, and a second protective layer 28. The connection member 403 includes a third substrate 42, a third intermediate layer 44, and a third superconducting layer 46.

The connection layer 30 includes a first portion 30x and a second portion 30y. The first portion 30x and the second portion 30y are separated from each other.

The first portion 30x is provided between the first superconducting layer 16 and the third superconducting layer 46. The first portion 30x is in contact with the first superconducting layer 16. The first portion 30x is in contact with the third superconducting layer 46.

The second portion 30y is provided between the second superconducting layer 26 and the third superconducting layer 46. The second portion 30y is in contact with the second superconducting layer 26. The second portion 30y is in contact with the third superconducting layer 46.

The connection layer 30 of the sixth embodiment has the same configuration as the connection layer 30 of the first embodiment illustrated in FIG. 1, the connection layer 30 of the second embodiment illustrated in FIG. 9, or the connection layer 30 of the third embodiment illustrated in FIG. 10. The first portion 30x and the second portion 30y have the same configuration as the connection layer 30 of the first embodiment illustrated in FIG. 1, the connection layer 30 of the second embodiment illustrated in FIG. 9, or the connection layer 30 of the third embodiment illustrated in FIG. 10.

In the superconducting wire 600 of the sixth embodiment, for example, a current flows from the first superconducting wire 401 to the second superconducting wire 402 through the first portion 30x of the connection layer 30, the connection member 403, and the second portion 30y of the connection layer 30.

First Modification

Figure 15:
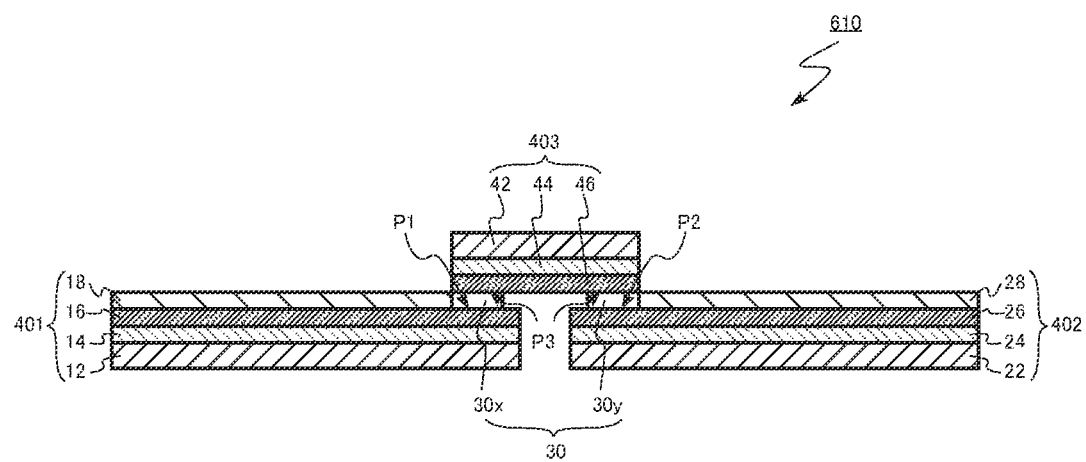
FIG. 15 is a schematic cross-sectional view of a first modification of the superconducting wire of the sixth embodiment.

FIG. 15 is a schematic cross-sectional view of a first modification of the superconducting wire of the sixth embodiment. A superconducting wire 610 of the first modification of the sixth embodiment is different from the superconducting wire 600 of the sixth embodiment in that a portion of a surface of the first superconducting layer 16 facing the third superconducting layer 46 is exposed and a portion of a surface of the second superconducting layer 26 facing the third superconducting layer 46 is exposed.

There is a region where the connection layer 30 is not present in the vicinity of the end portion on the second superconducting layer 26 side of the upper surface of the first superconducting layer 16. In addition, there is a region where the connection layer 30 is not present in the vicinity of the end portion on the first superconducting layer 16 side of the upper surface of the second superconducting layer 26.

Second Modification

Figure 16:
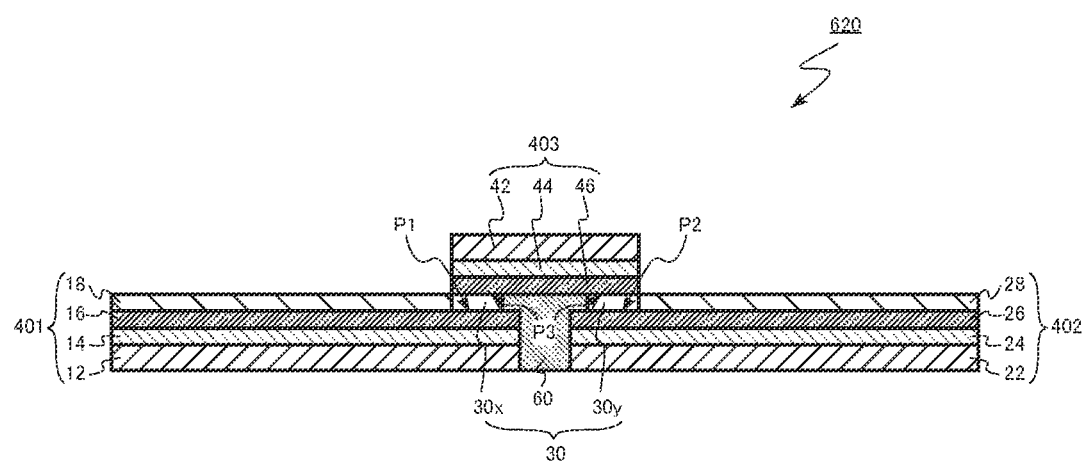
FIG. 16 is a schematic cross-sectional view of a second modification of the superconducting wire of the sixth embodiment.

FIG. 16 is a schematic cross-sectional view of a second modification of the superconducting wire of the sixth embodiment. A superconducting wire 620 of the second modification of the sixth embodiment is different from the superconducting wire 610 of the first modification in including a reinforcing material 60.

The reinforcing material 60 is provided between the first superconducting wire 401 and the second superconducting wire 402. The reinforcing material 60 is provided, for example, between the first superconducting layer 16 and the second superconducting layer 26. The reinforcing material 60 is provided, for example, between the first superconducting layer 16 and the third superconducting layer 46. The reinforcing material 60 is provided, for example, between the second superconducting layer 26 and the third superconducting layer 46. The reinforcing material 60 is provided, for example, between the first portion 30x and the second portion 30y.

By providing the reinforcing material 60, the mechanical strength of the superconducting wire 620 is improved.

The reinforcing material 60 is, for example, metal or resin. The reinforcing material 60 is, for example, solder. The reinforcing material 60 is, for example, solder containing silver (Ag) and indium (In).

Third Modification

Figure 17:
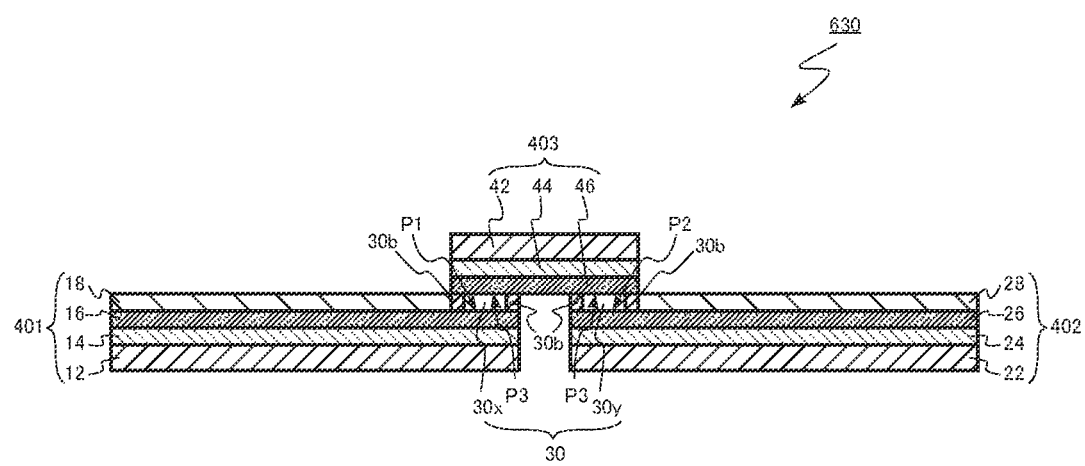
FIG. 17 is a schematic cross-sectional view of a third modification of the superconducting wire of the sixth embodiment.

FIG. 17 is a schematic cross-sectional view of a modification of the superconducting wire of the sixth embodiment. A superconducting wire 630 of a modification of the sixth embodiment is different from the superconducting wire 600 of the sixth embodiment in that the second substance 30b is disposed at both end portions of the first portion 30x of the connection layer 30 and at both end portions of the second portion 30y of the connection layer 30.

The second substance 30b disposed at both end portions of the first portion 30x of the connection layer 30 is continuously provided, for example, between the first superconducting layer 16 and the superconducting layer 46 of the connection member 403. In addition, the second substance 30b disposed at both end portions of the second portion 30y of the connection layer 30 is continuously provided, for example, between the second superconducting layer 26 and the superconducting layer 46 of the connection member 403.

By disposing the second substance 30b at both end portions of the first portion 30x of the connection layer 30 and at both end portions of the second portion 30y of the connection layer 30, stress applied to the first superconducting layer 16 and the second superconducting layer 26 and the superconducting layer 46 facing each other of the connection member can be dispersed when pressure is applied from above and below. As a result, cracks generated in the first superconducting layer 16, the second superconducting layer 26, and the superconducting layer 46 of the connection member can be suppressed, and a superconducting wire having high mechanical strength can be realized. It is also effective in obtaining a high critical current.

As described above, according to the sixth embodiment, it is possible to realize a superconducting wire lengthened by connecting two superconducting wires and having low electric resistance and high mechanical strength.

Seventh Embodiment

A superconducting coil of a seventh embodiment includes the superconducting wires of the fourth to sixth embodiments. Hereinafter, description of contents overlapping with those of the fourth to sixth embodiments may be partially omitted.

Figure 18:
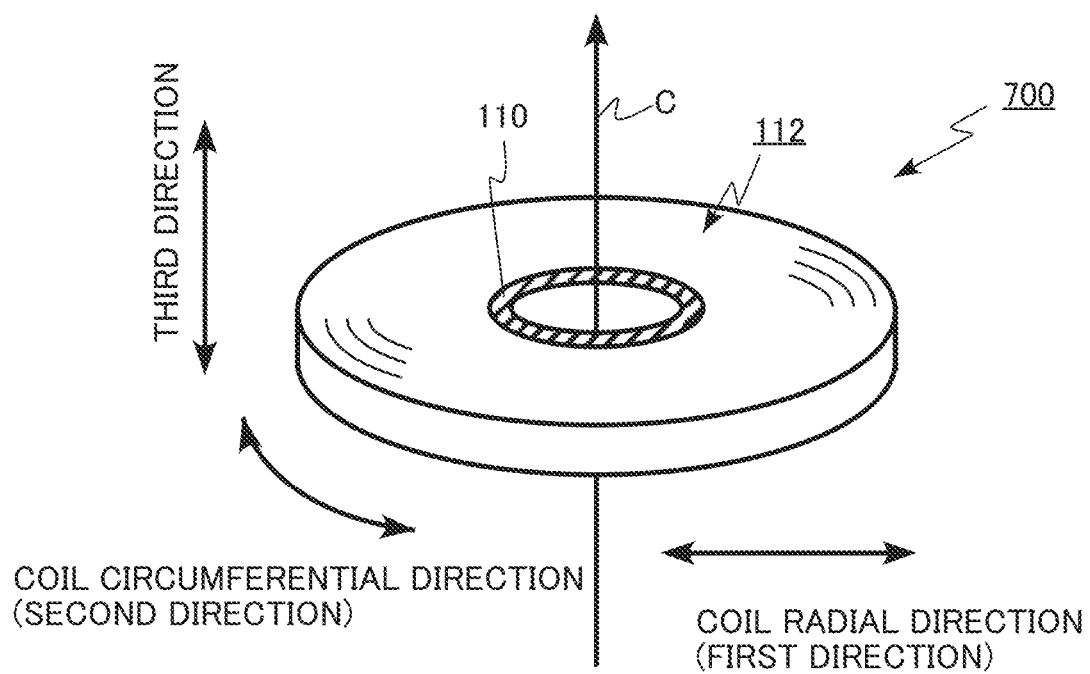
FIG. 18 is a schematic perspective view of a superconducting coil of a seventh embodiment.
Figure 19:
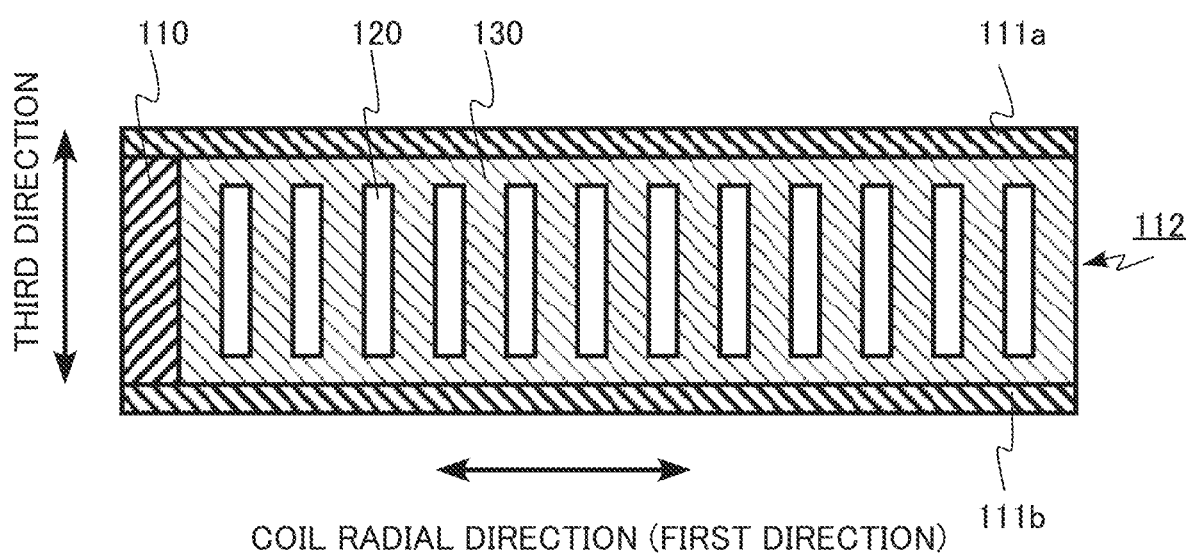
FIG. 19 is a schematic cross-sectional view of a superconducting coil of a seventh embodiment.

FIG. 18 is a schematic perspective view of the superconducting coil of the seventh embodiment. FIG. 19 is a schematic cross-sectional view of the superconducting coil of the seventh embodiment.

A superconducting coil 700 of the seventh embodiment is used as a coil for generating a magnetic field of a superconducting device such as NMR, MRI, a heavy particle radiotherapy device, or a superconducting magnetic levitation railway vehicle.

The superconducting coil 700 includes a winding frame 110, a first insulating plate 111a, a second insulating plate 111b, and a winding portion 112. The winding portion 112 includes a superconducting wire 120 and a wire interlayer 130.

FIG. 19 illustrates a state in which the first insulating plate 111a and the second insulating plate 111b are removed.

The winding frame 110 is made of, for example, fiber-reinforced plastic. The superconducting wire 120 has, for example, a tape shape. As illustrated in FIG. 16, the superconducting wire 120 is wound around the winding frame 110 in a concentric so-called pancake shape around a winding center C.

The wire interlayer 130 has a function of fixing the superconducting wire 120. The wire interlayer 130 has a function of suppressing destruction of the superconducting wire 120 due to vibration during use of the superconducting device or friction between the superconducting wire 120 and the wire interlayer 130.

The first insulating plate 111a and the second insulating plate 111b are made of, for example, fiber-reinforced plastic. The first insulating plate 111a and the second insulating plate 111b have a function of insulating the winding portion 112 from the outside. The winding portion 112 is located between the first insulating plate 111a and the second insulating plate 111b.

As the superconducting wire 120, the superconducting wires of the fourth to sixth embodiments are used.

As described above, according to the seventh embodiment, the superconducting coil with improved characteristics can be realized by including the superconducting wire having low electric resistance and high mechanical strength.

Eighth Embodiment

A superconducting device of an eighth embodiment is a superconducting device including the superconducting coil of the seventh embodiment. Hereinafter, description of contents overlapping with those of the seventh embodiment will be partially omitted.

Figure 20:
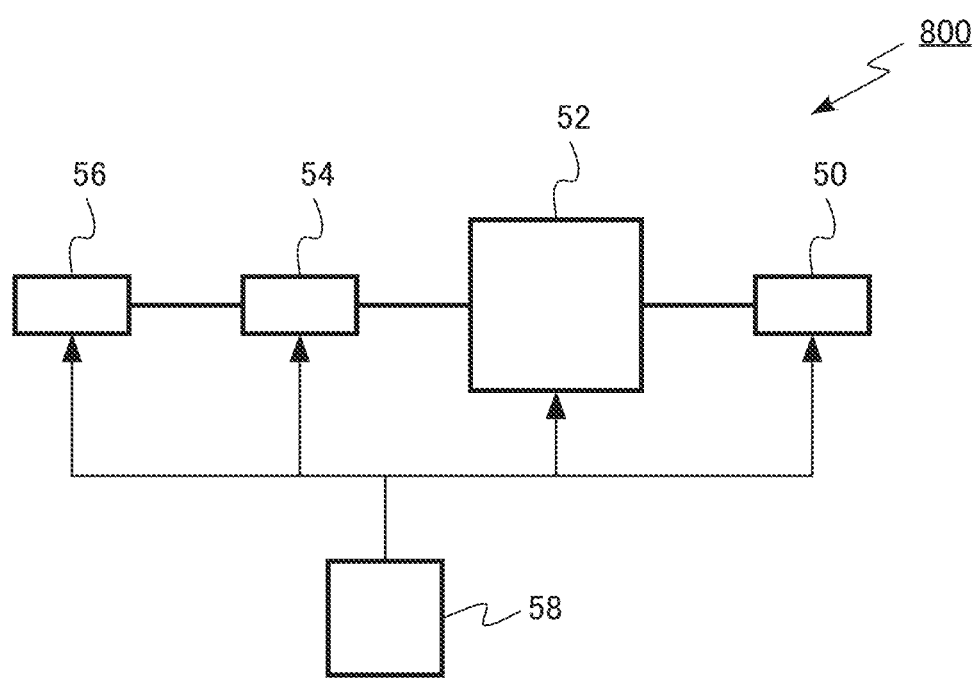
FIG. 20 is a block diagram of a superconducting device according to an eighth embodiment.

FIG. 20 is a block diagram of the superconducting device according to the eighth embodiment. The superconducting device of the eighth embodiment is a heavy particle radiotherapy device 800. The heavy particle radiotherapy device 800 is an example of a superconducting device.

The heavy particle radiotherapy device 800 includes an incidence system 50, a synchrotron accelerator 52, a beam transport system 54, an irradiation system 56, and a control system 58.

The incidence system 50 has, for example, a function of generating carbon ions to be used for treatment and performing preliminary acceleration for incidence into the synchrotron accelerator 52. The incidence system 50 includes, for example, an ion generation source and a linear accelerator.

The synchrotron accelerator 52 has a function of accelerating a carbon ion beam incident from the incidence system 50 to energy suitable for treatment. The superconducting coil 700 of the seventh embodiment is used for the synchrotron accelerator 52.

The beam transport system 54 has a function of transporting the carbon ion beam incident from the synchrotron accelerator 52 to the irradiation system 56. The beam transport system 54 includes, for example, a bending electromagnet.

The irradiation system 56 has a function of irradiating a patient to be irradiated with the carbon ion beam incident from the beam transport system 54. The irradiation system 56 has, for example, a rotary gantry that enables irradiation with a carbon ion beam from an arbitrary direction. The superconducting coil 700 of the seventh embodiment is used for the rotary gantry.

The control system 58 controls the incidence system 50, the synchrotron accelerator 52, the beam transport system 54, and the irradiation system 56. The control system 58 is, for example, a computer.

In the heavy particle radiotherapy device 800 according to the eighth embodiment, the superconducting coil 700 according to the seventh embodiment is used for the synchrotron accelerator 52 and the rotary gantry. Therefore, the heavy particle radiotherapy device 800 having excellent characteristics is realized.

In the eighth embodiment, the case of the heavy particle radiotherapy device 800 has been described as an example of a superconducting device. However, the superconducting device may be a nuclear magnetic resonance apparatus (NMR), a magnetic resonance imaging apparatus (MRI), or a superconducting magnetic levitation railway vehicle.

EXAMPLES

Examples 1 to 13 and Comparative Examples 1 to 3 will be described. Table 1 illustrates the first area ratio, the second area ratio, the third area ratio, and the fourth area ratio in Examples 1 to 13 and Comparative Examples 1 to 3. The evaluation results of Examples 1 to 13 and Comparative Examples 1 to 3 are illustrated in Tables 1.

TABLE 1

| | Area ratio (%) | | | | Evaluation results | |
| --- | --- | --- | --- | --- | --- | --- |
| | | | | | Relative electric resistance value | Relative connection strength |
| | First | Second | Third | Fourth | | |
| Example 1 | 10 | 15 | — | — | 1 | 1 |
| Example 2 | 12 | 13 | — | — | 0.3 | 1.4 |
| Example 3 | 20 | 18 | — | — | 0.01 | 1.2 |
| Example 4 | 10 | 12 | — | — | 0.6 | 1.2 |
| Example 5 | 15 | 17 | — | — | 0.03 | 1.1 |
| Example 6 | 15 | 20 | 13 | — | 0.4 | 1.2 |
| Example 7 | 25 | 30 | 22 | — | 0.05 | 1.2 |
| Example 8 | 17 | 22 | 24 | 18 | 0.04 | 1 |
| Example 9 | 14 | 21 | 15 | — | 0.4 | 1.5 |
| Example 10 | 23 | 26 | — | — | 0.05 | 2 |
| Example 11 | 13 | 18 | — | — | 0.3 | 1.1 |
| Example 12 | 14 | 16 | — | — | 0.2 | 1.1 |
| Example 13 | 15 | 13 | — | — | 1 | 0.8 |
| Comparative Example 1 | — | — | — | — | — | — |
| Comparative Example 2 | 55 | 60 | — | — | — | 2 |
| Comparative Example 3 | — | — | — | — | — | — |

Example 1

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layers (first and second superconducting layers).

Powders of $Gd_2O_3$, $BaCO_3$, and $CuO$ were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 930° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape.

A powder of silver oxide was dispersed in acetone to prepare a slurry. The obtained slurry was applied to exposed oxide superconducting layers (first and second superconducting layers) of the 10 cm superconducting wire, and then the slurry-applied portions of the superconducting wire were opposed to each other, superposed with a thin sheet-shaped superconductor interposed therebetween, and sandwiched between plates from above and below so as to have the structure illustrated in FIG. 8. In a state where the connection portion was sandwiched by the plate, the connection portion was screwed so that a load was applied to the connection portion, and the connection portion was placed in the furnace as it was.

Heating was performed to 500° C. in an air atmosphere, and a first heat treatment was performed to form a connection structure of a superconducting wire.

Terminals were attached to both ends of the superconducting wire after the connection, and the temperature dependence of the electric resistance was measured. As a result, it was confirmed that the electric resistance was clearly reduced at around 93K. With the electric resistance value of the present connection structure after a clear decrease in electric resistance as a reference value 1.0, the relative electric resistance value is illustrated in Examples and Comparative Examples below.

The connection structure of Example 1 maintained connectivity equivalent to room temperature even when the temperature was lowered to 80K, and had connection strength to withstand thermal shrinkage from room temperature to 80K. With a tensile load applied to both ends of the connection structure of Example 1 and a load when the connection portion is peeled off taken as a reference value 1.0, the relative strength is illustrated in Examples and Comparative Examples below.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. In the first interface between the first superconducting layer and the connection layer, the first area ratio per unit area of the first region in contact with the second substance and the first superconducting layer was 10%, and in the second interface between the second superconducting layer and the connection layer, the second area ratio per unit area of the second region in contact with the second substance and the second superconducting layer was 15%.

Example 2

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 950° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape.

The $Gd_2O_3$ powder, the $BaCO_3$ powder, and the CuO powder were mixed using a mortar. The mixed powder and the powder of silver oxide were dispersed in acetone to prepare a slurry. The obtained slurry was applied to the exposed oxide superconducting layer of the 10 cm superconducting wire, and then the slurry-applied portions of the superconducting wire were opposed to each other, superposed with a thin sheet-shaped superconductor interposed therebetween, and sandwiched between plates from above and below so as to have the structure illustrated in FIG. 8. In a state where the connection portion was sandwiched by the plate, the connection portion was screwed so that a load was applied to the connection portion, and the connection portion was placed in the furnace as it was.

Heating was performed to 800° C. in the air atmosphere to perform the first heat treatment. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after connection, and the temperature dependence of electric resistance was measured. As a result, a clear superconducting transition was confirmed at around 93K, and the relative electric resistance value was 0.3. In addition, the present connection structure maintained connectivity equivalent to room temperature even when the temperature was lowered to 80K, and had connection strength to withstand thermal shrinkage from room temperature to 80K. The relative connection strength was 1.4.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 12%, and the second area ratio was 13%.

$Gd_2O_3$, $BaCO_3$, CuO, and a compound of Gd, Cu, and O were present in the connection part.

Example 3

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 950° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape. The MOD solution was applied to a thin sheet-shaped superconductor, dried in an oven, and then heat-treated at 800° C.

A powder of silver oxide was dispersed in acetone to prepare a slurry. The obtained slurry was applied to the exposed oxide superconducting layer of the 10 cm superconducting wire, and then the slurry-applied portions of the superconducting wire were opposed to each other, superposed with a thin sheet-shaped superconductor interposed therebetween, and sandwiched between plates from above and below so as to have the structure illustrated in FIG. 8. In a state where the connection portion was sandwiched by the plate, the connection portion was screwed so that a load was applied to the connection portion, and the connection portion was placed in the furnace as it was.

The first heat treatment was performed by heating to 800° C. in a mixed atmosphere of Ar and oxygen. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after the connection, and the temperature dependence of electric resistance was measured. As a result, a clear superconducting transition was confirmed at around 93K, and the relative electric resistance value was 0.01. In addition, the present connection structure maintained connectivity equivalent to room temperature even when the temperature was lowered to 80K, and had connection strength to withstand thermal shrinkage from room temperature to 80K. The relative connection strength was 1.2.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 20%, and the second area ratio was 18%.

Example 4

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 950° C. and then heat-treated at 500° C. in an oxygen atmosphere to prepare an oxide superconductor having a composition of $GdBa_2Cu_3O_\delta$ ($6 \leq \delta \leq 7$). The obtained oxide superconductor was pulverized to obtain a powdery superconductor.

The $Gd_2O_3$ powder, the $BaCO_3$ powder, and the CuO powder were mixed using a mortar. A powder of the mixed powder, a powdery superconductor, and silver oxide was dispersed in acetone to prepare a slurry. The obtained slurry was applied to the exposed oxide superconducting layer of the 10 cm superconducting wire, and then the slurry-applied portions of the superconducting wire were superposed on each other while facing each other to have the structure illustrated in FIG. 9, and sandwiched between plates from above and below. In a state where the connection portion was sandwiched by the plate, the connection portion was screwed so that a load was applied to the connection portion, and the connection portion was placed in the furnace as it was.

Heating was performed to 800° C. in the air atmosphere to perform the first heat treatment. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after connection, and the temperature dependence of electric resistance was measured. As a result, a clear superconducting transition was confirmed at around 93K, and the relative electric resistance value was 0.6. In addition, the present connection structure maintained connectivity equivalent to room temperature even when the temperature was lowered to 80K, and had connection strength to withstand thermal shrinkage from room temperature to 80K. The relative connection strength was 1.2.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 10%, and the second area ratio was 12%.

$Gd_2O_3$, $BaCO_3$, CuO, and a compound of Gd, Cu, and O were present in the connection part.

Example 5

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 950° C. and then heat-treated at 500° C. in an oxygen atmosphere to prepare an oxide superconductor having a composition of $GdBa_2Cu_3O_\delta$ ($6 \leq \delta \leq 7$). The obtained oxide superconductor was pulverized to obtain a powdery superconductor. The MOD solution was applied to a powdery superconductor, dried in an oven, and then heat-treated at 800° C.

A powdery superconductor and a powder of silver oxide were dispersed in acetone to prepare a slurry. The obtained slurry was applied to the exposed oxide superconducting layer of the 10 cm superconducting wire, and then the slurry-applied portions of the superconducting wire were superposed on each other while facing each other to have the structure illustrated in FIG. 9, and sandwiched between plates from above and below. In a state where the connection portion was sandwiched by the plate, the connection portion was screwed so that a load was applied to the connection portion, and the connection portion was placed in the furnace as it was.

The first heat treatment was performed by heating to 800° C. in a mixed atmosphere of Ar and oxygen. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after connection, and the temperature dependence of electric resistance was measured. As a result, a clear superconducting transition was confirmed at around 93K, and the relative electric resistance value was 0.03. In addition, the present connection structure maintained connectivity equivalent to room temperature even when the temperature was lowered to 80K, and had connection strength to withstand thermal shrinkage from room temperature to 80K. The relative connection strength was 1.1.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 15%, and the second area ratio was 17%.

Example 6

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 3 cm for one and 10 cm for the remaining two. A line of 3 cm was wet etched between both end portions, and two lines of 10 cm were wet etched at a portion of 1 cm from the end portion using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 930° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape.

The $Gd_2O_3$ powder, the $BaCO_3$ powder, and the CuO powder were mixed using a mortar. The mixed powder and the powder of silver oxide were dispersed in acetone to prepare a slurry. The obtained slurry was applied to the exposed oxide superconducting layer (first and third superconducting layers) of the 10 cm superconducting wire and the exposed oxide superconducting layer (second superconducting layer) of the 3 cm superconducting wire, and then the slurry-applied portions of the superconducting wire were faced to each other, superposed with a thin sheet-shaped superconductor interposed therebetween, and sandwiched by plates from above and below so as to have the structure illustrated in FIG. 11. In a state where the connection portion was sandwiched by the plate, the connection portion was screwed so that a load was applied to the connection portion, and the connection portion was placed in the furnace as it was.

The first heat treatment was performed by heating to 800° C. in a mixed atmosphere of Ar and oxygen. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after connection, and the temperature dependence of electric resistance was measured. As a result, a clear superconducting transition was confirmed at around 93K, and the relative electric resistance value was 0.4. In addition, the present connection structure maintained connectivity equivalent to room temperature even when the temperature was lowered to 80K, and had connection strength to withstand thermal shrinkage from room temperature to 80K. The relative connection strength was 1.0.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 15%, the second area ratio was 20%, and the third area ratio was 13%.

Example 7

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 3 cm for one and 10 cm for the remaining two. A line of 3 cm was wet etched between both end portions, and two lines of 10 cm were wet etched at a portion of 1 cm from the end portion using a mixed solution of nitric acid, ammonia, and hydrogen peroxide to expose the oxide superconducting layer.

Powders of $Gd_2O_3$, $BaCO_3$, and $CuO$ were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 930° C. and then heat-treated at 500° C. in an oxygen atmosphere to prepare an oxide superconductor having a composition of $GdBa_2Cu_3O_\delta$ ($6 \leq \delta \leq 7$). The obtained oxide superconductor was pulverized to obtain a powdery superconductor. The MOD solution was applied to a powdery superconductor, dried in an oven, and then heat-treated at 800° C.

A powder of silver oxide was dispersed in acetone to prepare a slurry. The obtained slurry was applied to both end portions of an exposed oxide superconducting layer (second superconducting layer) of the 3 cm superconducting wire, and then heat-treated at 500° C. in the air.

A powdery superconductor and a powder of silver oxide were dispersed in acetone to prepare a slurry. The obtained slurry was applied to the exposed oxide superconducting layer (first and third superconducting layers) of the 10 cm superconducting wire and the exposed oxide superconducting layer (second superconducting layer) of the 3 cm superconducting wire, and then the slurry-applied portions of the superconducting wire were superposed on each other while facing each other so as to have the structure illustrated in FIG. 11, and sandwiched between plates from above and below. In a state where the connection portion was sandwiched by the plate, the connection portion was screwed so that a load was applied to the connection portion, and the connection portion was placed in the furnace as it was.

The first heat treatment was performed by heating to 800° C. in a mixed atmosphere of Ar and oxygen. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after connection, and the temperature dependence of electric resistance was measured. As a result, a clear superconducting transition was confirmed at around 93K, and the relative electric resistance value was 0.05. In addition, the present connection structure maintained connectivity equivalent to room temperature even when the temperature was lowered to 80K, and had connection strength to withstand thermal shrinkage from room temperature to 80K. The relative connection strength was 1.2.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 25%, the second area ratio was 30%, and the third area ratio was 22%.

Example 8

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 3 cm for one and 10 cm for the remaining two. Wet etching was performed using a mixed solution of nitric acid, ammonia, and hydrogen peroxide at both end portions of a line of 3 cm and at a portion of 2 lines of 10 cm at 1 cm from the end portion to expose the oxide superconducting layer.

Powders of $Gd_2O_3$, $BaCO_3$, and $CuO$ were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 930° C. and then heat-treated at 500° C. in an oxygen atmosphere to prepare an oxide superconductor having a composition of $GdBa_2Cu_3O_\delta$ ($6 \leq \delta \leq 7$). The obtained oxide superconductor was pulverized to obtain a powdery superconductor. The MOD solution was applied to a powdery superconductor, dried in an oven, and then heat-treated at 800° C.

A powdery superconductor and a powder of silver oxide were dispersed in acetone to prepare a slurry. The obtained slurry was applied to the exposed oxide superconducting layers (first and fourth superconducting layers) of the 10 cm superconducting wire and the exposed oxide superconducting layers (second and third superconducting layers) of the 3 cm superconducting wire, and then the slurry-applied portions of the superconducting wire were superposed on each other while facing each other to have the structure illustrated in FIG. 13, and sandwiched by plates from above and below. In a state where the connection portion was sandwiched by the plate, the connection portion was screwed so that a load was applied to the connection portion, and the connection portion was placed in the furnace as it was.

The first heat treatment was performed by heating to 800° C. in a mixed atmosphere of Ar and oxygen. Next, the mixture was cooled to around room temperature, oxygen gas was introduced into the furnace, the mixture was heated to 500° C. in an oxygen atmosphere, and a second heat treatment was performed to form a connection structure of the superconducting wire.

Terminals were attached to both ends of the superconducting wire after connection, and the temperature dependence of electric resistance was measured. As a result, a clear superconducting transition was confirmed at around 93K, and the relative electric resistance value was 0.04. In addition, the present connection structure maintained connectivity equivalent to room temperature even when the temperature was lowered to 80K, and had connection strength to withstand thermal shrinkage from room temperature to 80K. The relative connection strength was 1.0.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 17%, the second area ratio was 22%, the third area ratio was 24%, and the fourth area ratio was 18%.

Example 9

A connection structure was formed, and measurement and observation were performed in the same manner as in Example 6 except that air gaps were filled with indium silver solder so as to have the structure illustrated in FIG. 12 after the connection structure was formed.

Example 10

A connection structure was formed, measured, and observed in the same manner as in Example 5 except that the ratio of the silver oxide powder to the powdery superconductor was increased during slurry preparation. The connection layer had a structure as illustrated in FIG. 10, and the second substance was continuously present between the first superconducting layer and the second superconducting layer.

Example 11

A connection structure was formed, measured, and observed in the same manner as in Example 2 except that Gd (gadolinium) was changed to Eu (erbium).

Example 12

A connection structure was formed, measured, and observed in the same manner as in Example 2 except that Gd (gadolinium) was changed to Y (yttrium).

Example 13

A connection structure was formed, measured, and observed in the same manner as in Example 1 except that the silver oxide powder was changed to an indium powder and the first heat treatment was changed to 300° C. in an Ar atmosphere.

Comparative Example 1

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layers (first and second superconducting layers).

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 930° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape.

In order to obtain the structure illustrated in FIG. 8, the exposed superconducting layers were opposed to each other, superposed with a thin sheet-shaped superconductor interposed therebetween, and sandwiched by plates from above and below. In a state where the connection portion was sandwiched by the plate, the connection portion was screwed so that a load was applied to the connection portion, and the connection portion was placed in the furnace as it was.

Heating was performed to 800° C. in an air atmosphere, and a first heat treatment was performed to form a connection structure of a superconducting wire.

The sample of Comparative Example 1 was peeled off immediately after being taken out from the furnace, and did not form a connection structure.

Comparative Example 2

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 950° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape.

A small amount of ethyl acetate was added to the silver oxide powder to prepare a slurry. The obtained slurry was applied to the exposed oxide superconducting layer of the 10 cm superconducting wire, and then the slurry-applied portions of the superconducting wire were opposed to each other, superposed with a thin sheet-shaped superconductor interposed therebetween, and sandwiched between plates from above and below so as to have the structure illustrated in FIG. 8. In a state where the connection portion was sandwiched by the plate, the connection portion was screwed so that a load was applied to the connection portion, and the connection portion was placed in the furnace as it was.

Heating was performed to 500° C. in an air atmosphere, and a first heat treatment was performed to form a connection structure of a superconducting wire.

Terminals were attached to both ends of the superconducting wire after connection, and the temperature dependence of electric resistance was measured. As a result, a clear superconducting transition was not confirmed, and a high resistance value was illustrated. In addition, the present connection structure maintained connectivity equivalent to room temperature even when the temperature was lowered to 80K, and had connection strength to withstand thermal shrinkage from room temperature to 80K. The relative connection strength was 2.0.

The cross section of the connecting portion was observed by SEM and SEM-EDX, and the result illustrated that the first substance having a composition of $GdBa_2Cu_3O_\delta$ ($6 \leq \delta \leq 7$) and silver (second substance) were present. The first area ratio was 55%, and the second area ratio was 60%.

Comparative Example 3

Two oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length was 10 cm. A portion of 1 cm from an end portion of each superconducting wire was wet etched using a mixed solution of nitric acid, ammonia, and hydrogen peroxide to expose the oxide superconducting layer.

Powders of $Gd_2O_3$, $BaCO_3$, and CuO were prepared, weighed appropriately, and sufficiently mixed, and the mixed powder was heat-treated at 900° C. to obtain a calcined body. The calcined body was pulverized, and the resulting powder was compression molded to prepare a green compact. The obtained green compact was sintered at 950° C. and then heat-treated at 500° C. in an oxygen atmosphere to prepare an oxide superconductor having a composition of $GdBa_2Cu_3O_\delta$ ($6 \leq \delta \leq 7$). The surface of the obtained oxide superconductor was polished to be processed into a thin plate shape.

A powder of silver was dispersed in acetone to prepare a slurry. After the obtained slurry was applied to the exposed oxide superconducting layer of the 10 cm superconducting wire, the slurry-applied portions of the superconducting wire were opposed to each other, superposed with a thin sheet-shaped superconductor interposed therebetween, and sandwiched by plates from above and below so as to have the structure illustrated in FIG. 8. In a state where the connection portion was sandwiched by the plate, the connection portion was screwed so that a load was applied to the connection portion, and the connection portion was placed in the furnace as it was.

Heating was performed to 500° C. in an air atmosphere, and a first heat treatment was performed to form a connection structure of a superconducting wire.

The sample of Comparative Example 1 was peeled off immediately after being taken out from the furnace, and did not form a connection structure.

While certain embodiments have been described, these embodiments have been presented by way of example only, and are not intended to limit the scope of the inventions. Indeed, connection structure of superconducting layer, superconducting wire, superconducting coil, superconducting device, and connection method of superconducting layer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A connection structure of a superconducting layer comprising:
    a first superconducting layer;
    a second superconducting layer; and
    a connection layer provided between the first superconducting layer and the second superconducting layer, and the connection layer including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn),
    wherein a first area ratio at a first interface between the first superconducting layer and the connection layer is 1% or more and 50% or less, the first area ratio is an area ratio of a first region per unit area, the first region is a region where the second substance and the first superconducting layer are in contact with each other, and
    a second area ratio at a second interface between the second superconducting layer and the connection layer is 1% or more and 50% or less, the second area ratio is an area ratio of a second region per unit area, the second region is a region where the second substance and the second superconducting layer are in contact with each other.

2. The connection structure of a superconducting layer according to claim 1, wherein the first substance is in contact with the first superconducting layer and the second superconducting layer.

3. The connection structure of a superconducting layer according to claim 1, wherein the second substance includes a plurality of particles, and a median value of major diameters of the particles is 100 nm or more and 10 µm or less.

4. The connection structure of a superconducting layer according to claim 1, wherein the second substance includes a plurality of particles, particles in contact with the first superconducting layer among the particles have an aspect ratio of 5 or more, and particles in contact with the second superconducting layer among the particles have an aspect ratio of 5 or more.

5. The connection structure of a superconducting layer according to claim 1, wherein the second substance contains oxygen (O).

6. A connection structure of a superconducting layer comprising:
    a first superconducting layer;
    a second superconducting layer; and
    a connection layer provided between the first superconducting layer and the second superconducting layer, and the connection layer including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn), wherein the second substance is in contact with the first superconducting layer and the second superconducting layer, and the second substance is continuous between the first superconducting layer and the second superconducting layer.

7. The connection structure of a superconducting layer according to claim 6, wherein the first substance is in contact with the first superconducting layer and the second superconducting layer.

8. The connection structure of a superconducting layer according to claim 6, wherein an area ratio per unit area of the second substance in a cross section parallel to a direction from the first superconducting layer toward the second superconducting layer is 5% or more and 50% or less.

9. The connection structure of a superconducting layer according to claim 6, wherein a first area ratio at a first interface between the first superconducting layer and the connection layer is 1% or more and 50% or less, the first area ratio is an area ratio of a first region per unit area, the first region is a region where the second substance and the first superconducting layer are in contact with each other, and
a second area ratio at a second interface between the second superconducting layer and the connection layer is 1% or more and 50% or less, the second area ratio is an area ratio of a second region per unit area, the second region is a region where the second substance and the second superconducting layer are in contact with each other.

10. A superconducting wire comprising:
a first superconducting wire including a first superconducting layer;
a second superconducting wire including a second superconducting layer;
a third superconducting layer having a first surface and a second surface facing the first surface; and
a connection layer provided between the first superconducting layer and the third superconducting layer and between the second superconducting layer and the third superconducting layer, and the connection layer including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn),
wherein the first superconducting layer and the second superconducting layer are located on a side of the first surface of the third superconducting layer,
a first area ratio at a first interface between the first superconducting layer and the connection layer is 1% or more and 50% or less, the first area ratio is an area ratio of a first region per unit area, the first region is a region where the second substance and the first superconducting layer are in contact with each other, and
a second area ratio at a second interface between the second superconducting layer and the connection layer is 1% or more and 50% or less, the second area ratio is an area ratio of a second region per unit area, the second region is a region where the second substance and the second superconducting layer are in contact with each other, and
a third area ratio at a third interface between the third superconducting layer and the connection layer is 1% or more and 50% or less, the third area ratio is an area ratio of a third region per unit area, the third region is a region where the second substance and the third superconducting layer are in contact with each other.

11. The superconducting wire according to claim 10, wherein the first substance is in contact with the first superconducting layer, the second superconducting layer, and the third superconducting layer.

12. The superconducting wire according to claim 10, wherein the second substance includes a plurality of particles, and a median value of major diameters of the particles is 100 nm or more and 10 μm or less.

13. A superconducting coil comprising the superconducting wire according to claim 10.

14. A superconducting device comprising the superconducting coil according to claim 13.

15. A superconducting wire comprising:
a first superconducting wire including a first superconducting layer;
a second superconducting wire including a second superconducting layer;
a third superconducting layer having a first surface and a second surface facing the first surface; and
a connection layer provided between the first superconducting layer and the third superconducting layer and between the second superconducting layer and the third superconducting layer, and the connection layer including a first substance containing a rare earth element (RE), barium (Ba), copper (Cu), and oxygen (O) and a second substance containing at least one metal element selected from the group consisting of silver (Ag), aluminum (Al), indium (In), copper (Cu), tin (Sn), and zinc (Zn),
wherein the first superconducting layer and the second superconducting layer are located on a side of the first surface of the third superconducting layer,
a portion of the second substance is in contact with the first superconducting layer and the third superconducting layer,
the portion of the second substance is continuous between the first superconducting layer and the third superconducting layer,
a different portion of the second substance is in contact with the second superconducting layer and the third superconducting layer, and
the different portion of the second substance is continuous between the second superconducting layer and the third superconducting layer.

16. The superconducting wire according to claim 15, wherein the first substance is in contact with the first superconducting layer, the second superconducting layer, and the third superconducting layer.

17. A connection method of a superconducting layer, comprising:
preparing a first superconducting layer and a second superconducting layer;
sandwiching a substance containing a rare earth element (RE), barium (Ba), copper (Cu), and oxygen (O), and silver oxide between the first superconducting layer and the second superconducting layer; and
performing a heat treatment in a state where the first superconducting layer and the second superconducting layer are pressurized.

18. The connection method of a superconducting layer according to claim 17, wherein the heat treatment includes a first heat treatment at a first temperature, and a second heat treatment at a second temperature in an atmosphere having the same oxygen partial pressure as that of the first heat treatment or an oxygen partial pressure higher than that of the first heat treatment.

19. The connection method of a superconducting layer according to claim 18, wherein the first temperature is 800° C. or less.

20. The connection method of a superconducting layer according to claim 18, wherein the second temperature is lower than the first temperature.

* * * * *

UNITED STATES PATENT AND TRADEMARK OFFICE
CERTIFICATE OF CORRECTION

PATENT NO. : 11,961,631 B2
APPLICATION NO. : 17/689455
DATED : April 16, 2024
INVENTOR(S) : Masaya Hagiwara et al.

It is certified that error appears in the above-identified patent and that said Letters Patent is hereby corrected as shown below:

On the Title Page

Item (54), and in the Specification, Column 1, Line 5, "DEVCE," should read as --DEVICE,--.

Signed and Sealed this
Third Day of September, 2024

Katherine Kelly Vidal
*Director of the United States Patent and Trademark Office*